United States Patent
Nakajima et al.

(10) Patent No.: US 12,211,962 B2
(45) Date of Patent: Jan. 28, 2025

(54) BARRIER FILM, WAVELENGTH CONVERSION SHEET USING BARRIER FILM, AND DISPLAY DEVICE USING WAVELENGTH CONVERSION SHEET

(71) Applicant: DAI NIPPON PRINTING CO., LTD., Tokyo (JP)

(72) Inventors: Tatsuji Nakajima, Tokyo (JP); Takeshi Sakamoto, Tokyo (JP); Syuichi Tamura, Tokyo (JP); Tatsunori Itai, Tokyo (JP); Ryutaro Harada, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 526 days.

(21) Appl. No.: 17/595,115

(22) PCT Filed: May 12, 2020

(86) PCT No.: PCT/JP2020/018974
§ 371 (c)(1),
(2) Date: Nov. 9, 2021

(87) PCT Pub. No.: WO2020/230783
PCT Pub. Date: Nov. 19, 2020

(65) Prior Publication Data
US 2022/0216379 A1    Jul. 7, 2022

(30) Foreign Application Priority Data

May 13, 2019  (JP) .................................. 2019-090703
May 13, 2019  (JP) .................................. 2019-090704

(51) Int. Cl.
*H01L 33/50*    (2010.01)
*C08J 5/18*    (2006.01)
(Continued)

(52) U.S. Cl.
CPC .............. *H01L 33/505* (2013.01); *C08J 5/18* (2013.01); *C08J 7/0423* (2020.01);
(Continued)

(58) Field of Classification Search
CPC ......... G02B 5/0242; C08J 5/18; C08J 7/0423; B32B 2255/10; B32B 2255/20;
(Continued)

(56) References Cited

U.S. PATENT DOCUMENTS 8,759,853 B2 *  6/2014  Nam ....................... H01L 33/12
                                                       257/13
8,828,528 B2 *  9/2014  Yu .......................... C23C 16/403
                                                       428/701

(Continued)

FOREIGN PATENT DOCUMENTS

CN    106903954    6/2017
CN    106908990    6/2017
(Continued)

OTHER PUBLICATIONS

Muhammad Aamer Rafique Bhutta a, Yoshihiko Ohama b, Ken Tsuruta, "Strength properties of polymer mortar panels using methyl methacrylate solution of waste expanded polystyrene as binder" (2011), Elsevier, Construction and Building Materials vol. 25, Issue 2, Feb. 2011, pp. 779-784 (Year: 2011).*

(Continued)

*Primary Examiner* — Ali Naraghi
(74) *Attorney, Agent, or Firm* — HSML P.C.

(57) ABSTRACT

A barrier film for a wavelength conversion sheet, which can effectively suppress adhering of a light guide plate to the wavelength conversion sheet and suppresses damaging of a wavelength conversion sheet, a light guide plate, a diffusion plate, etc. A barrier film includes at least a barrier layer and base material layers. The barrier film has stacked on one (Continued)

surface thereof a mat layer including a resin and fillers which at least partially project from the mat layer. In a plan view, the proportion of the projecting fillers from the mat layer that are viewed as having a particle size at least twice the thickness of the mat layer is 20-80% of the total fillers projecting from the mat layer, and the total number of fillers in a square of 1 mm$^2$ in the plan view of the mat layer is 1800 or more.

9 Claims, 9 Drawing Sheets

(51) Int. Cl.
  *C08J 7/04* (2020.01)
  *G02F 1/1335* (2006.01)
  *G02F 1/13357* (2006.01)

(52) U.S. Cl.
  CPC .. *G02F 1/133603* (2013.01); *G02F 1/133605* (2013.01); *G02F 1/133607* (2021.01); *H01L 33/502* (2013.01); *C08J 2329/04* (2013.01)

(58) Field of Classification Search
  CPC ......... B32B 2255/26; B32B 2307/412; B32B 2457/202; B32B 27/08; B32B 27/281; B32B 27/286; B32B 27/304; B32B 27/306; B32B 27/32; B32B 27/36; B32B 7/12; G02F 1/133603; G02F 1/133607; G02F 1/133605; H01L 33/502; H01L 33/505; H01L 33/507
  See application file for complete search history.

(56) References Cited

U.S. PATENT DOCUMENTS

| | | | |
|---|---|---|---|
| 9,244,205 B2* | 1/2016 | Tsuno | G02B 5/0242 |
| 9,857,642 B2* | 1/2018 | Itou | G02F 1/136286 |
| 10,134,709 B1* | 11/2018 | Wu | H01L 33/502 |
| 10,903,524 B2* | 1/2021 | Iizuka | H01M 10/0585 |
| 2003/0021987 A1 | 1/2003 | Kobayashi et al. | |
| 2009/0310060 A1* | 12/2009 | Sudo | G02B 5/045 156/85 |
| 2010/0221533 A1* | 9/2010 | Tatsuzawa | H05K 3/323 428/343 |
| 2013/0242605 A1 | 9/2013 | Zhao et al. | |
| 2016/0195229 A1 | 7/2016 | Tokinoya | |
| 2018/0314102 A1* | 11/2018 | Toyama | H01L 33/507 |
| 2018/0364398 A1 | 12/2018 | Iwase | |
| 2019/0030859 A1* | 1/2019 | Murata | B32B 23/08 |
| 2019/0106548 A1* | 4/2019 | Akutsu | B29C 59/02 |
| 2019/0137826 A1* | 5/2019 | Park | G02F 1/133606 |
| 2019/0194530 A1 | 6/2019 | Sekiguchi et al. | |
| 2021/0149252 A1 | 5/2021 | Nonaka et al. | |

FOREIGN PATENT DOCUMENTS

| | | |
|---|---|---|
| JP | 2003-127294 | 5/2003 |
| JP | 2007-264113 | 10/2007 |
| JP | 2014-500983 | 1/2014 |
| JP | 2017-040730 | 2/2017 |
| JP | 2017-041571 | 2/2017 |
| JP | 2017-102389 | 6/2017 |
| JP | 2019-008906 | 1/2019 |
| JP | 2019-101174 | 6/2019 |
| KR | 10-2018-0056544 | 5/2018 |
| TW | 201234646 | 8/2012 |
| WO | 2015/037733 | 3/2015 |
| WO | 2015/095296 | 6/2015 |
| WO | 2017/154397 | 9/2017 |
| WO | 2018/043543 | 3/2018 |
| WO | 2018/225463 | 12/2018 |

OTHER PUBLICATIONS

Extended European Search Report issued in the EP Patent Application No. 20806329.7, Jan. 5, 2023, 5 pages.
Notification of Reasons for Refusal issued in the JP Patent Application No. 2020-083347, Jan. 31, 2023, 14 pages w/translation.
Office Action issued in Taiwanese Patent Application No. 109115857, Jul. 27, 2023, 12 pages w/translation.
International Search Report issued in International Application No. PCT/JP2020/018974, Aug. 4, 2020, 7 pages w/translation.
Office Action issued in corresponding Korean Patent Application No. 10-2021-7037269, Sep. 20, 2024, 16 pages w/translation.

* cited by examiner

BARRIER FILM, WAVELENGTH CONVERSION SHEET USING BARRIER FILM, AND DISPLAY DEVICE USING WAVELENGTH CONVERSION SHEET

TECHNICAL FIELD

The present invention relates mainly to a wavelength conversion sheet for use in a backlight source of a display device.

BACKGROUND ART

In recent years, with the development of personal computers, in particular, portable personal computers, the demand for liquid crystal display devices has increased. Recently, the popularity of liquid crystal televisions for household use has been increasing, and smartphones and tablets are becoming widespread. As a result, the liquid crystal display device market is expanding.

Such a liquid crystal display device in general has a color filter, a counter substrate, a liquid crystal cell unit having a liquid crystal layer sandwiched therebetween, and a light source called a backlight unit.

Recently, backlight members using quantum dot technologies have also been developed. Quantum dots refer to nanometer-sized fine particles of semiconductors. Quantum dots can be adjusted throughout the visible range of emission wavelengths by way of the quantum confinement effect (quantum-size effect) in which electrons and excitons are confined within nanometer-sized small crystals. Quantum dots can generate intense fluoresce at a narrow wavelength band, and can therefore illuminate a display device with the light of three primary colors having excellent color purity. Therefore, a backlight using quantum dots can achieve a display device having excellent color reproducibility.

A wavelength conversion sheet for use in a backlight source of this display device has a configuration combining: a phosphor layer in which nanometer-sized fine particles of semiconductors are dispersed in a resin layer; barrier films laminated on the surfaces of the phosphor layer so as to restrain deterioration of the phosphor layer; and an LED light source.

For example, a wavelength conversion sheet and a backlight unit using the same have been developed, in which a barrier film is laminated on a phosphor layer containing phosphor, and the barrier film is a barrier layer laminated on one side of a predetermined poly ethylene terephthalate film (WO 2015/037733). The barrier film used in the wavelength conversion sheet is excellent in barrier properties and transparency, whereby a display device capable of displaying more natural bright color and excellent color tone can be provided.

Patent Document 1: WO2015/037733

DISCLOSURE OF THE INVENTION

Problems to be Solved by the Invention

Here, in the case of using a wavelength conversion sheet in a display device, there are two mount types: an on-edge type, in which a wavelength conversion sheet is mounted along an end face of a light guide plate of a backlight; and another mount type such as a surface mount type using a light guide plate, in which a wavelength conversion sheet is mounted on a surface of a rear side of the light guide plate. Other than the mount types using a light guide plate, there is also a direct type, in which an LED instead of a light guide plate is arranged on a rear side, and a wavelength conversion sheet is irradiated with light emitted from a light source via a diffuser plate.

With the surface mount type, the surface of the rear side of the light guide plate is arranged in contact with the wavelength conversion sheet, whereby light emitted from the LED illuminates the wavelength conversion sheet via the light guide plate. The surface mount type can reduce influence of heat generated by the LED.

On the other hand, with the direct type, the surface of the rear side of the diffuser plate is arranged in contact with the wavelength conversion sheet, whereby light emitted from the LED is diffused by the diffuser plate and illuminates the wavelength conversion sheet. The direct type can easily maintain brightness of the entire screen and display an image with high brightness quality.

However, the present inventors have identified a phenomenon in which a plate such as the light guide plate or the diffuser plate and the barrier film of the wavelength conversion sheet may partly stick together, in the case in which the display device of a surface mount type or a direct type mounted with a wavelength conversion sheet transitions from a normal room temperature/humidity environment to a specific atmospheric environment such as a high or low normal room temperature and a high or low humidity, or from the specific atmospheric environment to the normal room temperature/humidity environment. Another phenomenon may occur in the case of transporting a wavelength conversion sheet laminated on plates such as a light guide plate and a diffuser plate, in which the wavelength conversion sheet and plates such as the light guide plate may rub against each other, and the wavelength conversion sheet and/or the plates such as the light guide plate may be scratched.

The present invention has been made against the aforementioned circumstances, and an object of the present invention is to provide a barrier film for a wavelength conversion sheet, which can effectively restrain a light guide plate, a diffuser plate or the like and a wavelength conversion sheet from sticking together, and restraining the wavelength conversion sheet, the light guide plate, the diffuser plate, or the like from being scratched.

Means for Solving the Problems

In order to solve the aforementioned problems, the present inventors have intensively researched and found that the aforementioned problems can be solved by a barrier film in which a mat layer including resin and fillers is laminated on one surface of the barrier film, and thus completed the present invention.

(1) A barrier film including a multilayer film including at least a barrier layer and a substrate layer, in which a mat layer including a resin and fillers is laminated on one surface of the barrier film, at least part of the fillers protruding from the mat layer, a ratio of the fillers protruding from the mat layer and being visually recognizable as having a particle size that is at least twice a thickness of the mat layer is 20% or more and 80% or less of a total amount of the fillers protruding from the mat layer, in a plan view of the mat layer, and a total number of the fillers in a square of 1 $mm^2$ in a plan view of the mat layer is 1,800 or more.

(2) The barrier film described in (1), in which the fillers included in the mat layer include at least one or more resins selected from the group consisting of acrylic resin, polystyrene resin, nylon resin, and polyethylene resin.

(3) The barrier film described in (1) or (2), in which the resin included in the mat layer includes acrylic resin.

(4) The barrier film described in any one of (1) to (3), in which a primer layer is laminated on a surface on an opposite side of the barrier film with respect to the mat layer.

(5) The barrier film described in any one of (1) to (4), in which the fillers include resin having compressive strength of 2.8 kgf/mm$^2$ or more as measured in accordance with JIS A 9511.

(6) The barrier film described in any one of (1) to (5), in which a coating amount of the mat layer after drying is 1.0 g/m$^2$ or more and 3.6 g/m$^2$ or less, and a haze value of the mat layer as measured in accordance with JIS K7136 is 10% or more and 35% or less.

(7) A wavelength conversion sheet, including: a phosphor layer including phosphor; and the barrier film described in any one of (1) to (6), in which the phosphor layer has a first surface and the barrier film has a second surface on an opposite side to a surface on which the mat layer is laminated, and in which the phosphor layer and the barrier film are laminated such that the first surface and the second surface face each other.

(8) A display device of a surface mount type, the display device including a light guide plate, in which an LCD panel, a polarization selective reflective sheet, a prism sheet, the wavelength conversion sheet described in (7), the light guide plate, and a reflective sheet are laminated in sequence,
   a light source unit is arranged at an end face of the light guide plate, and
   the light guide plate is arranged on a surface on a side of the mat layer of the wavelength conversion sheet.

(9) A display device of a direct type, the display device including a diffuser plate, in which
   an LCD panel, a polarization selective reflective sheet, a prism sheet, the wavelength conversion sheet described in (7), the diffuser plate, a light source unit, and a reflective sheet are laminated in sequence, and
   the diffuser plate is arranged on a surface on a side of the mat layer of the wavelength conversion sheet.

Effects of the Invention

The barrier film for a wavelength conversion sheet of the present invention can effectively restrain the light guide plate or the diffuser plate and the wavelength conversion sheet from sticking together, and restrain the wavelength conversion sheet, the light guide plate, the diffuser plate or the like from being scratched.

PREFERRED MODE FOR CARRYING OUT THE INVENTION

Hereinafter, specific embodiments of the present invention will be described in detail; however, the present invention is not limited to the following embodiments, and can be implemented with appropriate modifications within the scope of the object of the present invention.

<<1. Wavelength Conversion Sheet>>

Figure 1:
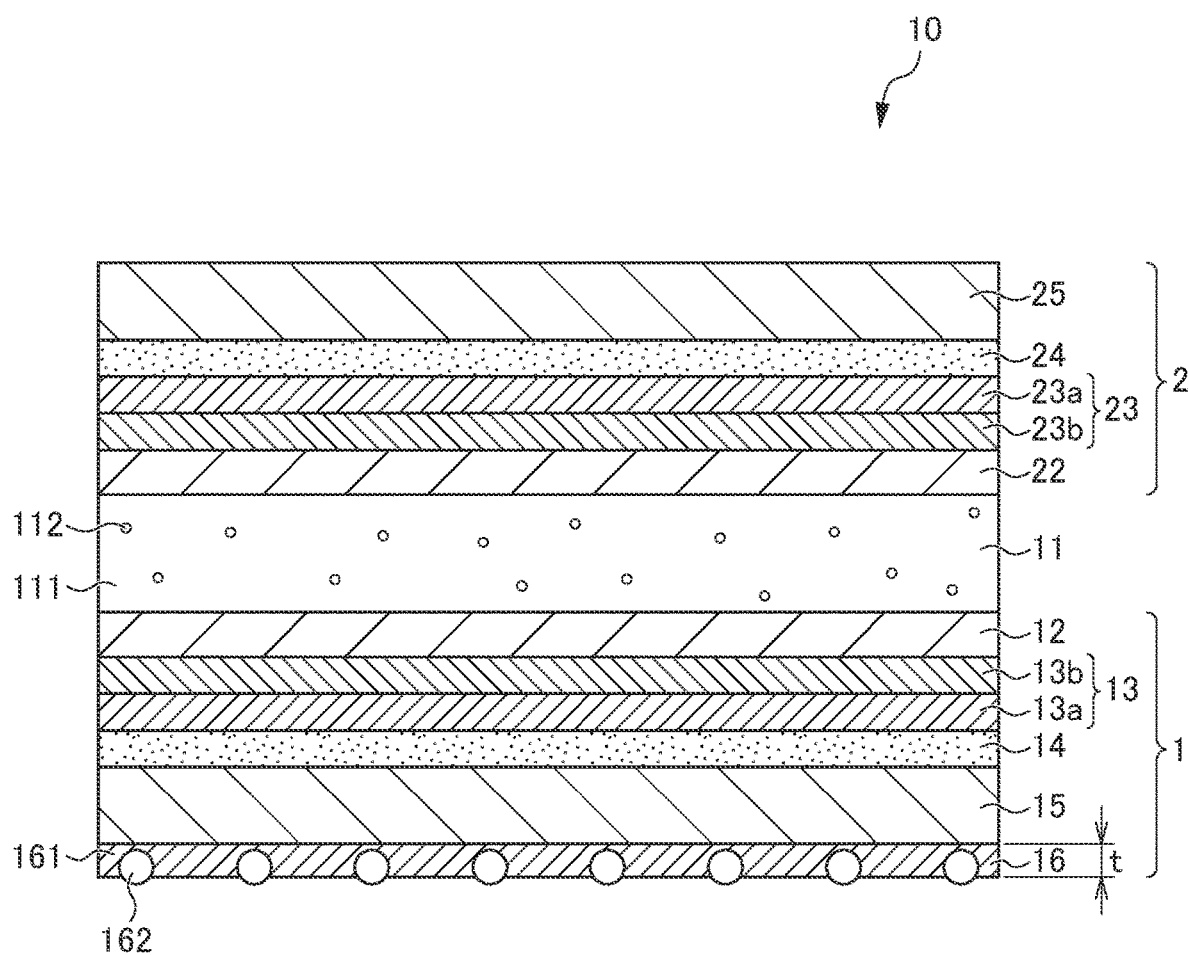
FIG. 1 is a cross-sectional view schematically illustrating a wavelength conversion sheet according to an embodiment of the present invention.

As illustrated in FIG. 1, a wavelength conversion sheet 10 includes: a phosphor layer 11 containing phosphor 112 and sealing resin 111; and a barrier film 1 and a barrier film 2 laminated on the surfaces of the phosphor layer 11, respectively. The barrier films 1 and 2 are laminated on the surfaces of the phosphor layer 11, respectively, whereby barrier properties are imparted to the phosphor layer. In the present specification, in the case of using the wavelength conversion sheet 10 as a backlight source, the surfaces of the phosphor layer refer to the surface on the side where the light source is arranged (light receiving surface side), as well as the surface on the side opposite to the side where the backlight source is arranged (light emitting surface side).

The barrier film 1 is arranged on the side that is in contact with the surface on the rear side of a light guide plate of the wavelength conversion sheet 10. A mat layer 16 is laminated on one surface of the barrier film 1. The light guide plate is arranged on the surface of the mat layer, whereby the light guide plate and the wavelength conversion sheet can be effectively restrained from sticking together. The barrier film 2 is arranged on the side opposite to the side that is in contact with the light guide plate of the wavelength conversion sheet 10, and is not provided with the mat layer in the present embodiment, as illustrated in FIG. 1.

The wavelength conversion sheet 10 illustrated in FIG. 1 is configured such that the mat layer 16 is only laminated on one surface of the barrier film 1; however, a mat layer may also be laminated on the surface of the barrier film 2 (not illustrated) (the surface on the side of a second substrate layer 25 in FIG. 1). For example, in the case in which an optical film is arranged on the side of the barrier film 2 (the second substrate layer 25 side) of the wavelength conversion sheet 10 of FIG. 1, if the optical film is arranged on the surface of the mat layer, the optical film and the wavelength conversion sheet can be effectively restrained from sticking together, in a similar manner.

<<2. Barrier Film>>

Figure 2:
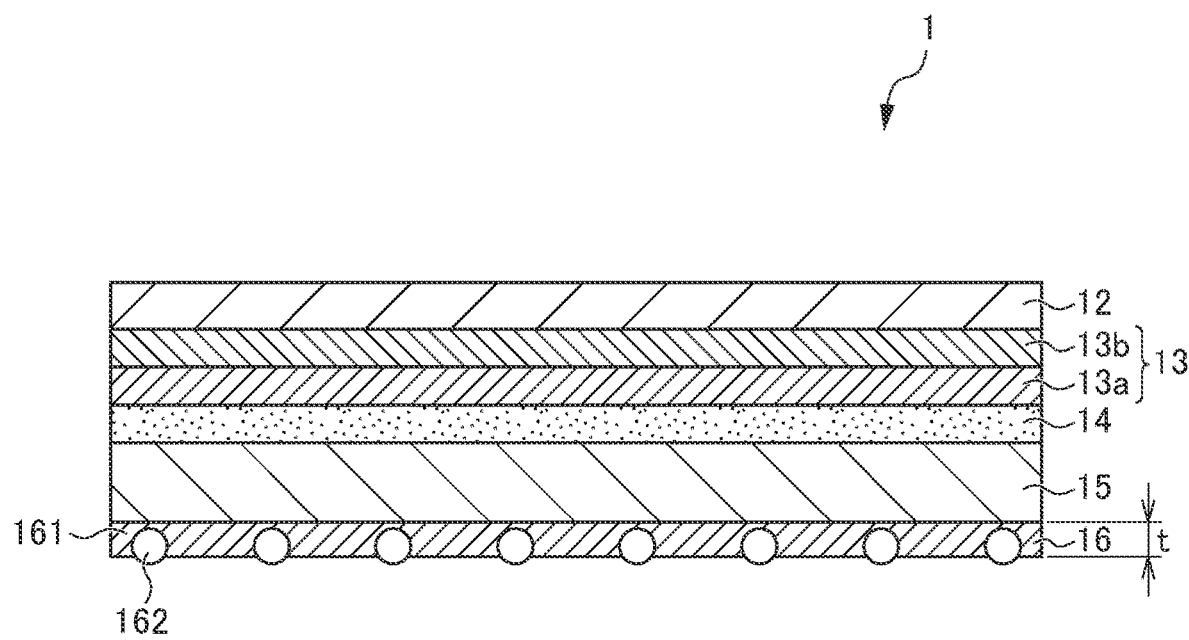
FIG. 2 is a cross-sectional view schematically illustrating a barrier film arranged on a display surface side of a display device of the wavelength conversion sheet according to an embodiment of the present invention.

As illustrated in FIG. 2, the barrier film 1 according to the present embodiment is a multilayer film including at least a barrier layer and a substrate layer. Specifically, a first substrate layer 12, a barrier layer 13 (an inorganic oxide thin film layer 13b and an organic coating layer 13a), an adhesive layer 14, and a second substrate layer 15 are laminated in this order, in which the mat layer 16 is laminated on the surface on the second substrate layer 15 side of the barrier film 1. The light guide plate is arranged on the surface of the mat layer, whereby the light guide plate and the wavelength conversion sheet can be effectively restrained from sticking together. The mat layer 16 of the barrier film 1 is omitted from the barrier film 2, in which a first substrate layer 22, a barrier layer 23 (an inorganic oxide thin film layer 23b and an organic coating layer 23a), an adhesive layer 24, and a second substrate layer 25 are laminated in this order. The order of lamination in the barrier film 1 is not limited to the aforementioned order; for example, the barrier layer 13 and the first substrate layer 12 may be replaced with each other in the layer structure, specifically, the barrier layer 13 (the organic coating layer 13a and the inorganic oxide thin film layer 13b), the first substrate layer 12, the adhesive layer 14, the second substrate layer 15, and the mat layer 16 may be laminated in this order. Likewise, the order of lamination in the barrier film 2 may be changed; specifically, the barrier layer 23 (the organic coating layer 23a and the inorganic oxide thin film layer 23b), the first substrate layer 22, the adhesive layer 24, and the second substrate layer 25 may be laminated in this order. In the example illustrated above, the first substrate layer, the inorganic oxide thin film layer, and the organic coating layer are laminated in this order; however, the present invention is not limited thereto, and the first substrate layer, the organic coating layer, and the inorganic oxide thin film layer may be laminated in this order. Hereinafter, each of the layers will be described using the barrier film 1 illustrated in FIG. 2.

[Mat Layer]

The mat layer 16 is a layer containing resin 161 and fillers 162, in which the surface of the mat layer 16 is not uniformly flat, and at least part of the fillers contained in the mat layer protrudes. The mat layer as such can effectively restrain the mat layer 16 and the light guide plate 6 from sticking together.

The phrase "at least part of the fillers contained in the mat layer protrudes" means that the surface of the mat layer is not uniformly flat and the fillers create undulation on the surface of the mat layer and/or that at least part of the fillers is exposed from the surface of the mat layer.

The mat layer is provided to the barrier film, whereby when the barrier film or the wavelength conversion sheet is rolled, the barrier film or the wavelength conversion sheet can be prevented from sticking together as well. Therefore, the barrier film or the wavelength conversion sheet can be rolled for storage or transportation.

In particular, in the case of transporting a display device, in which the light guide plate is arranged on the surface of the mat layer of the wavelength conversion sheet, the mat layer and the light guide plate may rub against each other to cause scratches. Alternatively, the mat layer and the light guide plate may rub against each other to generate debris from the mat layer, and the debris may damage the mat layer and the light guide plate. Such scratches on the mat layer or the light guide plate may deteriorate the appearance of the display device.

Accordingly, the barrier film according to the present embodiment is characterized in that, the ratio of the fillers protruding from the mat layer and having a particle size that is at least twice the thickness of the mat layer, i.e., the ratio of the fillers protruding from the mat layer and being visually recognizable as having a particle size that is at least twice the thickness of the mat layer is 20% or more and 80% or less of the total amount of the fillers protruding from the mat layer, in a plan view of the mat layer. In the case in which the ratio of such fillers is less than 20%, scratch resistance of the mat layer may be deteriorated, and the mat layer and the light guide plate may not be effectively restrained from sticking together. In the case in which the ratio of such fillers exceeds 80%, scratch resistance of the mat layer is deteriorated. Here, the thickness of the mat layer 16 refers to a thickness t of the layer of the resin 161 configuring the mat layer, as illustrated in FIGS. 1 and 2.

The barrier film according to the present embodiment is characterized in that the total number of the fillers in a square of 1 mm$^2$ in a plan view of the mat layer is 1,800 or more. As a result, the mat layer and the light guide plate can be effectively restrained from sticking together, and scratch resistance of the mat layer can be improved. The upper limit of the total number of the fillers in a square of 1 mm$^2$ in a plan view of the mat layer is not limited in particular, but is preferably 20,000 or less, or preferably 15,000 or less, for example. Here, the total number of the fillers in a square of 1 mm$^2$ in a plan view of the mat layer refers to the total number of the fillers appearing on the surface of the mat layer when the mat layer is viewed from the front side, and does not include the number of the fillers which are buried in the mat layer and visually unrecognizable from the surface.

The ratio of the fillers visually recognizable as having a particle size that is at least twice the thickness of the mat layer can be measured by observing, for example, a predetermined area (e.g., 258×260 µm) of the surface of the mat layer in a plan view, with a microscope (a microscope such as a laser microscope, a scanning electron microscope, or other microscopes). If necessary, the screen to be measured is adjusted such that the plane portion is horizontal. An image is acquired and brightness is adjusted such that the filler portions can be extracted. Particles and diameters of the particles are calculated from the image having the brightness adjusted. The ratio of the fillers visually recognizable as having a particle size that is at least twice the thickness of the mat layer is calculated from the thickness of the mat layer as calculated from the coating amount or the like.

The total number of the fillers in a square of 1 mm$^2$ in a plan view of the mat layer can be calculated by converting the total number of the fillers in the predetermined area (e.g., 258×260 µm) into the number per 1×1 mm$^2$.

For example, OLS4000, which is a laser microscope manufactured by Olympus Corporation, can be used as a microscope for obtaining the ratio of the fillers and the total number of the fillers in a square of 1 mm$^2$ in a plan view.

The mat layer is provided, in which the ratio of the fillers protruding from the mat layer as well as the total number of the fillers in the predetermined area fall within the aforementioned ranges, whereby the mat layer or the light guide plate (diffuser plate) can be effectively restrained from being scratched.

The same is true in the case in which the mat layer is laminated on the surface of the barrier film 2 (the surface on the second substrate layer 25 side in FIG. 1), in which the mat layer and the optical film are in contact with each other. Specifically, the mat layer is provided, in which the ratio of the fillers protruding from the mat layer as well as the total number of the fillers in the predetermined area fall within the aforementioned ranges, whereby the mat layer or the optical film can be effectively restrained from being scratched.

In particular, in the case in which the optical film is a prism sheet, the prism may be chipped depending on the shape of the prism sheet; therefore, this optical film may be prone to scratches as compared to other optical films.

Therefore, in the case of using a prism sheet as the optical film, the mat layer is laminated, in which the ratio of the fillers protruding from the mat layer on the surface of the barrier film 2 as well as the total number of the fillers in a predetermined area fall within the aforementioned ranges, whereby the optical film (prism sheet) can be effectively restrained from being scratched.

The filler 162 includes resin having compressive strength equal to or greater than 2.8 kgf/mm$^2$. The compressive strength of the resin is preferably 3.0 kgf/mm$^2$ or greater, and more preferably 4.0 kgf/mm$^2$ or greater. Examples of the resin having compressive strength of 2.8 kgf/mm$^2$ or greater may include acrylic resin. The filler 162 has compressive strength of 2.8 kgf/mm$^2$ or greater, whereby effects can be achieved, such as the fillers are unlikely to be crushed or chip off by foreign matter, foreign matter is unlikely to directly scratch the surface of the mat layer, and scratch resistance can be improved. Acrylic resin is a polymer containing, as a monomer component, unsaturated ethylene monomer having at least one carboxyl group or carboxylic acid ester group selected from the group consisting of methacrylic acid, acrylic acid, methacrylic acid ester, and acrylic acid ester. If the compressive strength of the filler 162 is less than 2.8 kgf/mm$^2$, when contaminated with foreign matter or the like, the fillers may be crushed or chip off, foreign matter is likely to directly scratch the surface of the mat layer, and scratch resistance may be deteriorated, which are unfavorable.

The thickness of the mat layer is not limited in particular, as long as the effects of the present invention can be achieved. For example, the thickness of the mat layer is preferably 1.0 μm or more and 50.0 μm or less, and more preferably 1.5 μm or more and 10.0 μm or less. The thickness of the mat layer refers to the thickness (t in FIGS. 1 and 2) of the resin portion other than the fillers inside the mat layer, and does not include the thickness of the portion of the fillers protruding (being exposed) from the resin. The thickness of the mat layer can be measured by observing, for example, a cross section of the mat layer with a scanning electron microscope or the like.

The coating amount of the mat layer after drying is preferably 1.0 g/m$^2$ or more and 3.6 g/m$^2$ or less, in order that the thickness of the mat layer falls within the aforementioned range. When the coating amount of the mat layer after drying falls within such a range, the fillers can be restrained from being embedded in the mat layer, and impurities can be restrained from entering between the mat layer and the light guide plate. If the coating amount of the mat layer after drying is less than 1.0 g/m$^2$, the mat layer may be thinner than the fillers, impurities may enter between the mat layer and the light guide plate (diffuser plate), and the mat layer and the light guide plate (diffuser plate) may be scratched. If the coating amount of the mat layer after drying exceeds 3.6 g/m$^2$, the fillers may be embedded in the mat layer, and the function of the mat layer may be impaired.

The haze value of the mat layer is preferably 10% or more and 35% or less, and more preferably 10% or more and 25% or less. When the haze value of the mat layer is 10% or more, the number of the fillers contained in the mat layer is sufficient, scratch resistance of the mat layer can be improved, and the mat layer and the light guide plate can be effectively restrained from sticking together. When the haze value of the mat layer is 35% or less, scratch resistance of the mat layer can be improved, and the function of the display device can be improved. If the haze value of the mat layer is less than 10%, the number of the fillers contained in the mat layer is not sufficient; therefore, scratch resistance of the mat layer may be deteriorated, and the mat layer and the light guide plate may not be effectively restrained from sticking together. If the haze value of the mat layer exceeds 35%, scratch resistance of the mat layer is deteriorated, and since the haze value is excessively high, the function of the display device is deteriorated. A haze value can be measured by using a haze meter compliant with JIS K7136. Hereinafter, the resin and the fillers contained in the mat layer will be described.

(Resin)

The resin 161 contained in the mat layer is not limited in particular, as long as the object of the present invention can be achieved; and examples thereof may include acrylic resin, epoxy resin, urethane resin, polyester resin, polyester acrylate resin, polyurethane acrylate resin, acrylic urethane resin, epoxy acrylate resin, and the like. Of these, acrylic resin is preferable from a perspective of providing hardness.

In the case of containing acrylic resin, the ratio of acrylic resin to 100 parts by mass of resin contained in the mat layer is preferably 60 parts by mass or more, and more preferably 80 parts by mass or more.

(Filler)

The fillers are formed in a spherical shape, whereby the light guide plate and the wavelength conversion sheet are prevented from sticking together. The type of filler is not limited in particular; and examples thereof may include acrylic resin, polystyrene resin, polyethylene resin, and the like. The fillers preferably contain resin having compressive strength of 2.8 kgf/mm$^2$ or more as measured in accordance with JIS A 9511; and examples thereof may include acrylic resin, polystyrene resin, and the like. Aside from the aforementioned acrylic resin and polystyrene resin, the fillers may use silica fine particles, melamine, nylon, benzoguanamine-based fine particles, and the like. The materials can be ranked in descending order of hardness: silica fine particles, melamine, nylon, polystyrene resin, acrylic resin, and polyethylene resin.

An average particle size of the fillers is preferably 1 μm or more and 50 μm or less, and more preferably 1.5 μm or more and 10 μm or less. When the average particle size of the fillers is 1 μm or more, at least part of the fillers is more exposed from the surface of the mat layer, the mat layer 16 and the light guide plate 6 can be more effectively restrained from sticking together, and scratch resistance of the mat layer can be improved. When the average particle size of the fillers is 50 μm or less, the fillers released from the mat layer can be restrained from deteriorating the function of the mat layer or generating scratches on the mat layer.

An average particle size is obtained as a D50 value by measuring, for example, particle size distribution in accordance with JIS 28820 and 28822. An average particle size can be measured with, for example, a dynamic light scattering method or laser diffraction scattering method or via SEM or TEM observation.

The content of the fillers based on the total amount of the mat layer is preferably 5% by mass or more and 50% by mass or less, and more preferably 10% by mass or more and 40% by mass or less. When the content is 5% by mass or more, the mat layer and another member such as the light guide plate can be more effectively prevented from sticking together. When the content is 50% by mass or less, a sufficient amount of resin for forming the mat layer can be secured, whereby film formability of the mat layer is improved.

Of the fillers contained in the mat layer, the content of the fillers protruding from the mat layer based on the total amount of the mat layer is preferably 2% by mass or more and 25% by mass or less, and more preferably 5% by mass or more and 20% by mass or less.

Difference between a refractive index of the fillers and a refractive index of the resin contained in the mat layer is preferably 0.5 or less, more preferably 0.3 or less, and still more preferably 0.1 or less.

(Additive)

As necessary, additives such as a stabilizer, a curing agent, a cross-linking agent, a lubricant, an ultraviolet absorber, and the like may be optionally added to the mat layer according to the present embodiment.

[Substrate Layer]

The substrate layer configures a multilayer film of the barrier film, and is a layer mainly composed of resin. The material usable for the substrate layer is not limited in particular, as long as the material does not impair the function of the wavelength conversion sheet; and examples thereof may include resin such as polyimide (PI), polyethylene naphthalate (PEN), polyethylene terephthalate (PET), polyethylene butyrate (PBT), amorphous polyarylate, polysulfone, polyether sulfone, polyetherimide, fluorinated resin, or liquid crystal polymer. From a perspective of transparency or heat resistance so as not to impair the function of the wavelength conversion sheet, polyethylene naphthalate (PEN) and polyethylene terephthalate (PET) are preferable. The materials of the first substrate layer 12, 22 and the second substrate layer 15, 25 may be the same material or may be different materials.

The thickness of the substrate layer of the barrier film 1 is not limited in particular; and the thickness of the substrate layer forming the barrier layer (for example, the first substrate layer 12, 22 in FIG. 1) is preferably 8 μm or more and 150 μm or less, and more preferably 8 μm or more and 100 μm or less, so as not to impair the performance of the barrier layer.

The first substrate layer 12, 22, the barrier layer 13, 23, the adhesive layer 14, 24, and the second substrate layer 15, 25 are laminated in this order to form the barrier film 1, 2 configuring the wavelength conversion sheet of FIG. 1. The barrier film 1 is not limited to the barrier film in which the first substrate layer, the barrier layer, and the second substrate layer are laminated in this order, and may be a multilayer film including at least a barrier layer and a substrate layer. Specifically, unlike the barrier film configuring the wavelength conversion sheet of FIG. 1, a barrier layer may be arranged in the outermost layer, or a single substrate layer may be provided. However, in the case of the barrier film configuring the wavelength conversion sheet of FIG. 1, the barrier layer 13, 23 is not exposed to the outermost surface of the barrier film; therefore, the risk of causing scratches or cracks in the barrier layer can be reduced, and defects in the phosphor layer caused by scratches or cracks in the barrier layer can be restrained. Three or more substrate layers may be provided.

In the barrier film 1, 2 configuring the wavelength conversion sheet 10 of FIG. 1, the thickness of the first substrate layer 12, 22 arranged in the vicinity of the phosphor layer is preferably 8 μm or more and 50 μm or less, more preferably 8 μm or more and less than 25 μm, and still more preferably 8 μm or more and 20 μm or less. When the thickness of the first substrate layer 12, 22 is 8 μm or more, barrier properties of the first substrate layer 12, 22 can be improved. When the thickness of the first substrate layer 12, 22 is 50 μm or less, less oxygen and water vapor can pass through the side faces of the first substrate layer 12, 22.

In the case of the barrier film configuring the wavelength conversion sheet of FIG. 1, the thickness of the second substrate layer 15, 25 is preferably greater than 25 μm and 200 μm or less, more preferably 38 μm or more and 175 μm or less, and still more preferably 50 μm or more and 150 μm or less. When the thickness of the second substrate layer 15, 25 is greater than 25 μm and 200 μm or less, flexibility of the wavelength conversion sheet can be improved, and handling properties in the case of bonding the display device to the backlight source can be improved.

The substrate layer preferably has high total light transmittance as measured in accordance with JIS K 7361, in order to avoid blocking of light from the backlight source. Specifically, the total light transmittance of the first substrate layer 12, 22 and the second substrate layer as measured in accordance with JIS K 7361 is preferably 85% or more, and more preferably 90% or more.

A desired surface treated layer may be provided on the surface of the substrate layer in advance as needed, in order to improve adhesion to the barrier layer to be described later (not illustrated). For example, corona discharge treatment, ozone treatment, low temperature plasma treatment using oxygen gas or nitrogen gas, glow discharge treatment, oxidation treatment using chemicals, or other pretreatments may be optionally applied, and for example, a corona treated layer, an ozone treated layer, a plasma treated layer, an oxidation treated layer, or the like may be formed as a surface treated layer.

The aforementioned surface pretreatment is carried out as a method of improving adhesion and the like between the film or sheet composed of various types of resin and the barrier layer to be described later; and for example, as another method of improving adhesion, a primer coating agent layer, an undercoating agent layer, an anchor coating agent layer, an adhesive layer, or a vapor-deposited anchor coating agent layer can be optionally formed in advance as a surface treated layer on the surface of the film or sheet composed of various types of resin.

Examples of a resin composition usable for the coating agent layer may include a resin composition containing, as a main component of a vehicle, polyester resin, polyamide resin, polyurethane resin, epoxy resin, phenolic resin, (meth) acrylic resin, polyvinyl acetate resin, polyolefin resin such as polyethylene or polypropylene, or copolymer or modified resin thereof, cellulosic resin, or others.

(Barrier Layer)

The barrier layer is a layer which imparts barrier properties to the barrier film; and in general, the barrier layer is an organic coating layer formed by coating a coating agent containing water-soluble polymer or the like such as polyvinyl alcohol, and/or an inorganic oxide thin film layer formed by vapor-depositing inorganic oxide. The barrier layer is a layer composed of a plurality of layers in which an organic coating layer and an inorganic oxide thin film layer are laminated. The barrier layer is not limited to a layer composed of a plurality of layers in which an organic coating layer and an inorganic oxide thin film layer are laminated, and may be a layer in which a single organic coating layer or a single inorganic oxide thin film layer is provided, or may be a layer in which two or more layers of an organic coating layer and an inorganic oxide thin film layer are alternately laminated. The organic coating layer is laminated in close contact with the primer layer, whereby occurrence of scratches or cracks can be reduced in the inorganic oxide thin film layer which is laminated further inner than the organic coating layer.

The organic coating layer is a layer which prevents various types of secondary damages from occurring in the post-process and imparts high barrier properties to the barrier film. The organic coating layer is formed by, for example, applying a coating solution of a gas barrier composition containing a water-soluble polymer and an aqueous solution or water/alcohol mixed solution containing at least one metal alkoxide and hydrolysis products, or tin chloride. The organic coating layer preferably contains, as components, at least one selected from the group consisting of hydroxyl group-containing polymer compound, metal alkoxide, metal alkoxide hydrolysate, and metal alkoxide polymer. Examples of the water-soluble polymer for use in the organic coating layer may include polyvinyl alcohol, polyvinyl pyrrolidone, ethylene-vinyl alcohol copolymer, and the like; and in particular, gas barrier properties of the organic coating layer can be the most excellent when using polyvinyl alcohol and/or ethylene-vinyl alcohol copolymer. When a gas barrier composition is prepared, the content of polyvinyl alcohol-based resin and/or ethylene-vinyl alcohol copolymer based on 100 parts by mass of the total amount of alkoxides is in the range of 5 parts by mass or more to 500 parts by mass or less, and preferably about 20 parts by mass or more to 200 parts by mass or less.

A silane coupling agent and the like can also be added to the gas barrier composition. Known organic reactive group-containing organoalkoxysilane can be used as the silane coupling agent. In the present invention, organoalkoxysilane having an epoxy group is suitable, in particular; and for example, γ-glycidoxypropyltrimethoxysilane, γ-glycidoxypropylmethyldiethoxysilane, β-(3,4-epoxycyclohexyl)ethyltrimethoxysilane or the like can be used. One or more of the silane coupling agents as described above may be mixed for use. In the present invention, the silane coupling agent as described above can be used in an amount within a range of 1 part by mass or more and 20 parts by mass or less per 100 parts by mass of the alkoxysilane.

The film thickness of the organic coating layer is not limited in particular, and is preferably 100 nm or more and 500 nm or less. When the film thickness of the organic coating layer is 100 nm or more, sufficient barrier properties can be imparted to the barrier film. When the film thickness of the organic coating layer is 500 nm or less, transparency is excellent, and properties of the wavelength conversion sheet will not be deteriorated.

Similar to the organic coating layer, the inorganic oxide thin film layer is a layer which imparts high barrier properties to the barrier film. An example of the inorganic oxide thin film layer may be a layer consisting of aluminum oxide, silicon oxide, magnesium oxide, or mixture thereof. From a perspective of imparting sufficient barrier properties to the barrier film, and a perspective of producibility of the barrier film, a thin film layer containing aluminum oxide or silicon oxide as a main component is preferable.

An example of a method of forming an inorganic oxide thin film layer may include a method by vapor-depositing inorganic oxide. Examples of the method of forming a deposited film may include a physical vapor deposition method (PVD method) such as a vacuum deposition method, a sputtering method, and an ion plating method, or a chemical vapor deposition method (CVD method) such as a plasma enhanced chemical vapor deposition method, a thermochemical vapor deposition method, and a photochemical vapor deposition method.

The film thickness of the inorganic oxide thin film layer is not limited in particular, and is preferably 5 nm or more and 500 nm or less. When the film thickness of the inorganic oxide thin film layer is 5 nm or more, the inorganic oxide thin film layer becomes uniform, and sufficient barrier properties can be imparted to the barrier film. When the film thickness of the inorganic oxide thin film layer is 500 nm or less, sufficient flexibility can be imparted to the inorganic oxide thin film layer, and the risk of causing scratches and cracks in the inorganic oxide thin film layer can be reduced.

The barrier layer preferably has high total light transmittance as measured in accordance with JIS K 7361, in order to avoid blocking of light from the backlight source. Specifically, the total light transmittance of the barrier film as measured in accordance with JIS K 7361 is preferably 85% or more, and more preferably 90% or more. The total light transmittance is a value measured when the barrier layer is formed on a PET film (film thickness: 12 μm).

(Adhesive Layer)

As illustrated in FIG. 2, as for the barrier film 1 according to the present embodiment, the adhesive layer 14 may be laminated between the barrier layer 13 and the second substrate layer 15. The following examples may be usable as an adhesive composing the adhesive layer 14: polyvinyl acetate adhesives; polyacrylic acid ester adhesives consisting of homopolymer such as ethyl, butyl, 2-ethylhexyl ester of acrylic acid, or copolymer thereof with methyl methacrylate, acrylonitrile, styrene, or the like; cyanoacrylate adhesives; ethylene copolymer adhesives consisting of copolymer of ethylene and monomer such as vinyl acetate, ethyl acrylate, acrylic acid, or methacrylic acid; cellulose-based adhesives; polyester adhesives; polyamide adhesives; polyimide adhesives; amino resin adhesives consisting of urea resin or melamine resin; phenol resin adhesives; epoxy adhesives; polyurethane adhesives; reactive (meth) acrylic adhesives; rubber adhesive consisting of chloroprene rubber, nitrile rubber, styrene-butadiene rubber, or the like; silicone-based adhesives; or inorganic adhesives consisting of alkali metal silicate, low melting point glass, or the like.

The composition type of the adhesive composing the adhesive layer may be any one of an aqueous type, a solution type, an emulsion type, a dispersion type, and the like; the form of the adhesive may be any one of a film/sheet form, a powder form, a solid form, and the like; and the adhesive mechanism may be any one of a chemical reaction type, a solvent volatilization type, a hot melt type, a thermal compression type, and the like.

The adhesive composing the adhesive layer can be applied by, for example, roll coating, gravure coating, knife coating, dip-coating, spray coating, other coating methods, a printing method, or the like; and the coating amount of the adhesive is desirably 0.1 g/m² or more and 10 g/m² or less (in dry condition).

Instead of the adhesive layer consisting of the aforementioned adhesive, for example, a resin layer formed of thermosetting resin or thermoplastic resin containing a cross-linking agent or the like may be laminated. A method of adhesion by extrusion lamination may be used, in which thermoplastic resin such as EVA, ionomer, polyvinyl butyral (PVB), polyethylene resin or the like is melted, and the thermoplastic resin thus melted is extruded and laminated.

(Phosphor Layer)

The phosphor layer 11 is a layer for adjusting the emission wavelength of light emitted from the backlight source. The phosphor layer 11 contains one or more types of phosphors consisting of quantum dots.

The quantum dots forming the phosphor 112 are semiconductor particles having a predetermined size and achieving the quantum confinement effect. When quantum dots absorb light from an excitation source and reach an energy excited state, the quantum dots emit energy corresponding to the energy bandgap of the quantum dots. The energy bandgap can be adjusted by adjusting the size or material composition of the quantum dots, whereby various levels of wavelength band energy can be obtained. In particular, the quantum dots can generate intense fluoresce at a narrow wavelength band. Therefore, the display device can be illuminated with light of three primary colors having excellent color purity, whereby the display device having excellent color reproducibility can be obtained.

The phosphor is a light-emitting core coated with a protective layer (shell). For example, cadmium selenide (CdSe), cadmium telluride (CdTe), or cadmium sulfide (CdS) can be used for the core. Zinc sulfide (ZnS) can be used for the protective layer.

The phosphor layer 11 can be formed by laminating the sealing resin 111 containing the phosphor 112. For example, the phosphor layer can be formed by coating the surface of the substrate layer with a mixed solution containing the phosphor 112 and the sealing resin 111 and curing the mixed solution. Examples of the sealing resin 111 may include: photopolymerized resin of acrylic resin such as polyester (meth)acrylate, urethane (meth)acrylate, polyester-urethane (meth)acrylate, polyether (meth)acrylate, polyol (meth)acrylate, melamine (meth)acrylate, isocyanurate (meth)acrylate, epoxy (meth)acrylate, or (meth)acrylate resin; thermosetting resin such as phenolic resin, urea resin, melamine resin, epoxy resin, unsaturated polyester resin, polyester resin, silicone resin, or polyurethane resin; or resin containing a cross-linking agent or the like in thermoplastic resin such as EVA, ionomer, polyvinyl butyral (PVB), or polyethylene resin. From a perspective of adhesion between the phosphor layer and the substrate layer, at least one or more resins selected from the group consisting of acrylic resin, epoxy resin, urethane resin, and polyester resin is preferably included. One of the foregoing may be used alone, or one or more thereof may be mixed for use. An adhesion layer for enhancing adhesion may be formed.

<<3. Display Device>>

Figure 3:
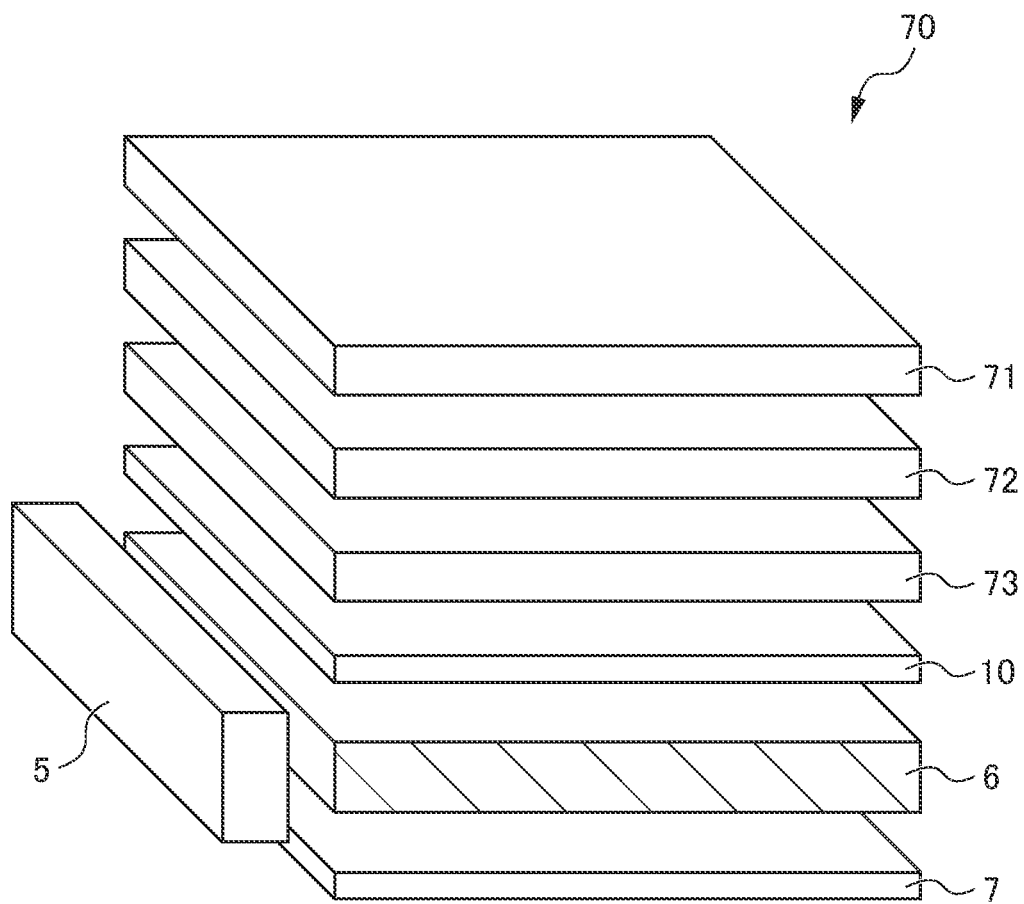
FIG. 3 is a perspective view schematically illustrating a configuration of the display device of a surface mount type according to an embodiment of the present invention.
Figure 4:
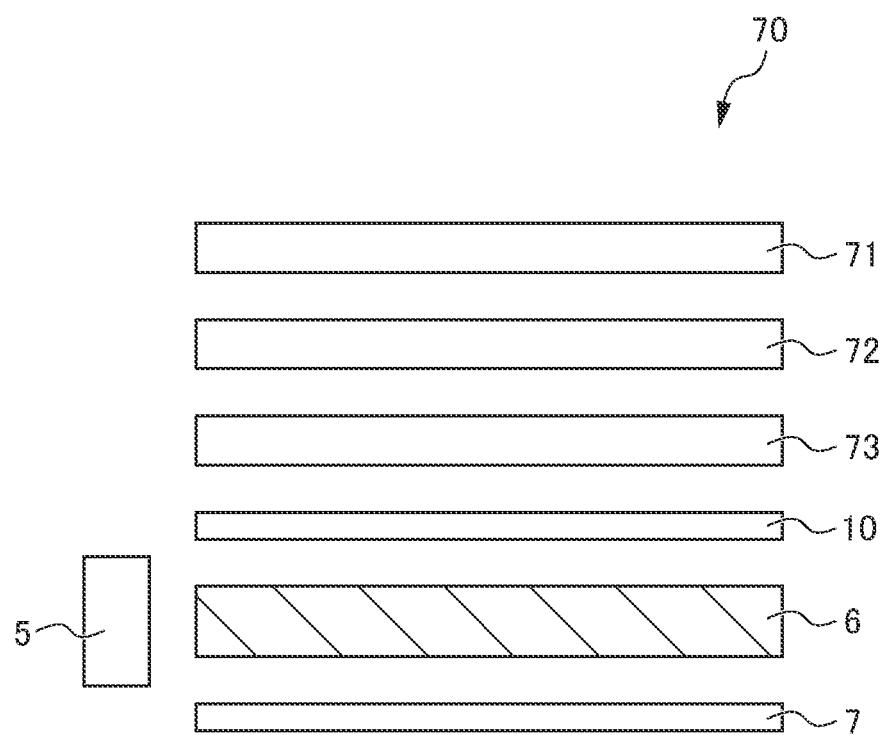
FIG. 4 is a cross-sectional view of the display device illustrated in FIG. 3.
Figure 5:
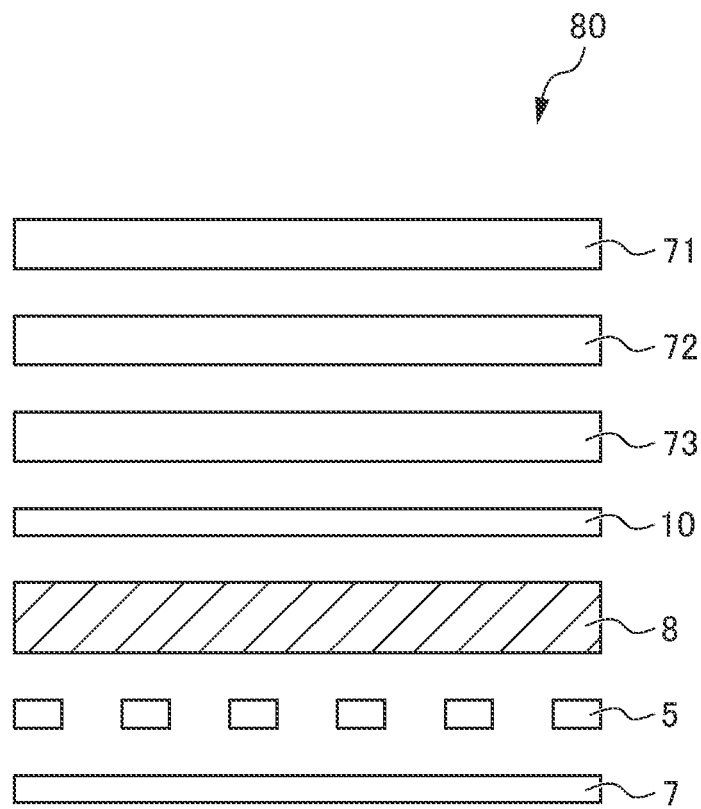
FIG. 5 is a cross-sectional view schematically illustrating a configuration of a display device of a direct type according to an embodiment of the present invention.

A display device including the aforementioned wavelength conversion sheet will be described with reference to FIGS. 3 to 5. FIG. 3 is a perspective view schematically illustrating a configuration of the display device of a surface mount type according to an embodiment of the present invention. FIG. 4 is a cross-sectional view of the display device illustrated in FIG. 3. The cross-sectional view illustrated in FIG. 4 is a cross-sectional view of a cross-section parallel with the direction of laminating the wavelength conversion sheet 10 and the like configuring the display device, and parallel with the direction of arranging the light source unit and the light guide plate (direction in which light emitted from the light source unit travels). FIG. 5 is a cross-sectional view schematically illustrating a configuration of a display device of a direct type according to an embodiment of the present invention.

An LCD panel 71, a polarization selective reflective sheet 72, a prism sheet 73, the wavelength conversion sheet 10, a light guide plate 6, and a reflective sheet 7 are laminated in sequence, in the display device 70 illustrated in FIGS. 3 and 4. A light source unit 5 is arranged along at least one end face (side face) of the light guide plate 6 of the display device 70. The LCD panel 71 is a display unit of a transmission type, which is formed of liquid crystal display elements of a transmission type and forms video information on the display surface thereof. The polarization selective reflective sheet 72 is a sheet-like member that functions to transmit light of a specific polarization state and reflect light of other polarization states; and for example, DBEF Series (manufactured by Sumitomo 3M Limited) can be used for the polarization selective reflective sheet 72. In the case of using the polarization selective reflective sheet 72 as such, the transmission axis of the polarization selective reflective sheet 72 is preferably arranged so as to be parallel with the transmission axis of the polarizing plate (not illustrated) located on the light receiving side of the LCD panel 71, from a perspective of improving brightness and light use efficiency. The prism sheet 73 is an optical sheet that functions to deflect the traveling direction of light (or condense light) emitted from the upper surface of the light guide plate 6 toward the front direction (direction normal to the panel surface of the LCD panel).

The light guide plate 6 is a substantially flat plate-shaped member for guiding light. Light emitted from the light source unit 5 is incident on a flat plate-shaped end face of the light guide plate 6, guided while being totally reflected by the upper surface and the lower surface of the light guide plate 6 inside the light guide plate 6, and emitted from the upper surface of the light guide plate 6 toward the prism sheet 73 side, as appropriate. The reflective sheet 7 is a sheet-like member capable of reflecting light, arranged on the opposite side of the light guide plate 6 with respect to the prism sheet 73, functions to re-reflect the light emitted from the lower surface of the light guide plate 6 toward the inside of the light guide plate 6, and improves use efficiency of light emitted from the light source unit 5. From a perspective of enhancing light use efficiency and the like, the reflective sheet 7 preferably has mirror reflectivity (specular reflectivity) in principle. For example, a sheet-like member in which at least a reflecting surface (surface on the light guide plate 6 side) is formed of a material with high reflectance such as metal can be used as the reflective sheet 7; or a sheet-like member having a surface layer including a thin film formed of a material with high reflectance (e.g., metal thin film) can be used as the reflective sheet 7. The present invention is not limited thereto, and the reflective sheet 7 may be, for example, a sheet-like member made of white resin with diffuse reflectivity in principle and high reflectance. The light source unit 5 is a light source that emits light illuminating the LCD panel 71. From a perspective of making light evenly incident on one end face of the light guide plate 6, the light source unit 5 is formed as a plurality of point light sources arranged at a predetermined interval, for example. For example, an LED (light emitting diode) light source or an organic EL (electro luminescence) light source is used as the point light sources. The display device 70 of FIGS. 3 and 4 is a display device of a so-called surface mount type, in which light is emitted from the light source unit 5 as a backlight source arranged on the end face of the light guide plate 6, incident on the light guide plate 6, guided inside the light guide plate 6, emitted from the upper surface of the light guide plate 6, and transmitted through the wavelength conversion sheet 10, the prism sheet 73, polarization selective reflective sheet 72, and the LCD panel 71 in sequence. The reflective sheet 7 is provided as necessary.

In the case of the display device 70 of a so-called surface mount type, the wavelength conversion sheet 10 is arranged so as to contact the light guide plate 6. Here, in the case of the conventional barrier film for a wavelength conversion sheet or the conventional wavelength conversion sheet, the barrier film and the light guide plate may stick together, becoming a factor in significantly deteriorating the display properties of the liquid crystal display device. In the case of transporting the display device, the wavelength conversion sheet and the light guide plate may be rubbed with each other, scratching the wavelength conversion sheet and/or the light guide plate, becoming a factor in deteriorating the display properties of the display device.

However, as long as the light guide plate is arranged on the surface of the mat layer of the wavelength conversion sheet of the display device, even in the case of the display device of a surface mount type, the barrier film and the light guide plate can be effectively restrained from sticking together, and the wavelength conversion sheet and/or the light guide plate can be restrained from being scratched.

Although a conventionally known light guide plate can be used as the light guide plate, the surface in contact with the barrier film of the light guide plate can be formed in a wedge shape as well, in order to more effectively prevent the barrier film and the light guide plate from sticking together.

Another display device including the aforementioned wavelength conversion sheet will be described with reference to FIG. 5. A display device 80 of FIG. 5 is a display device of a so-called direct type, in which the light source unit 5 is arranged on a rear side of a diffuser plate 8, the wavelength conversion sheet 10 is arranged on the opposite side of the diffuser plate 8 with respect to the light source unit 5, and light emitted from the light source unit 5 irradiates the wavelength conversion sheet 10. Similar to the display device 70 illustrated in FIGS. 3 and 4 described above, the prism sheet 73, the polarization selective reflective sheet 72, and the LCD panel 71 are laminated in sequence on the opposite side of the wavelength conversion sheet 10 with respect to the diffuser plate 8. The reflective sheet 7 is provided on the opposite side of the light source unit 5 with respect to the diffuser plate 8; when light is emitted from the light source unit 5 and reflected without entering the diffuser plate 8, the reflective sheet 7 re-reflects the light toward the diffuser plate 8 side, whereby light use efficiency can be improved. The light source unit 5 illustrated in FIG. 5 is formed by arranging a plurality of point light sources (LEDs) along the plate surface of the diffuser plate 8 at an equal interval in a grid shape.

In the case of the display device 80 of a so-called direct type, the wavelength conversion sheet 10 is arranged so as to contact the diffuser plate 8. The diffuser plate 8 is arranged on the surface of the mat layer 16 of the wavelength conversion sheet 10, whereby the barrier film and the diffuser plate can be effectively restrained from sticking together, and the wavelength conversion sheet and/or the diffuser plate can be restrained from being scratched, for the same reason as in the display device 70.

<<4. Barrier Film of Another Embodiment>>

A barrier film and a wavelength conversion sheet according to another embodiment of the present invention will be described with reference to FIGS. 6 to 9.

Figure 6:
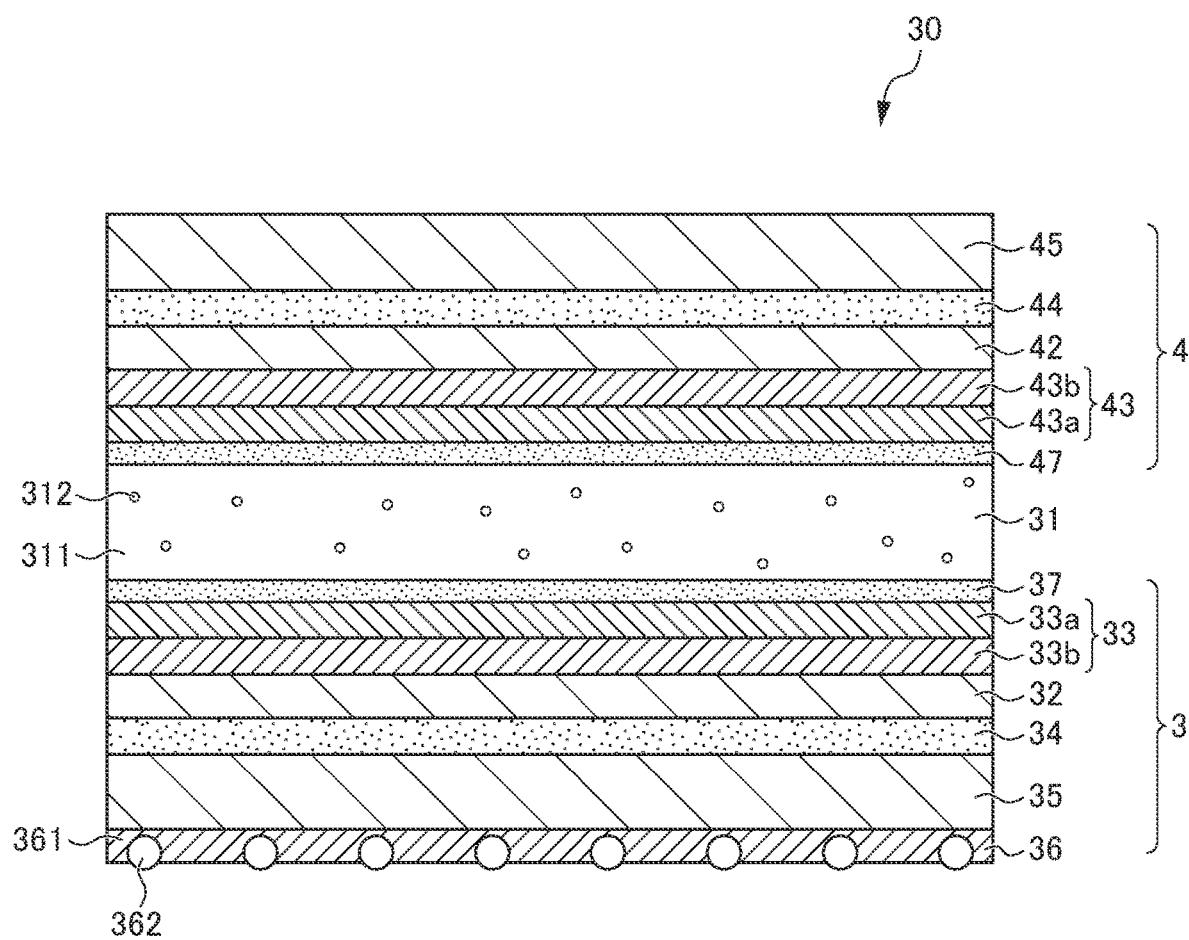
FIG. 6 is a cross-sectional view schematically illustrating a wavelength conversion sheet according to another embodiment of the present invention.
Figure 7:
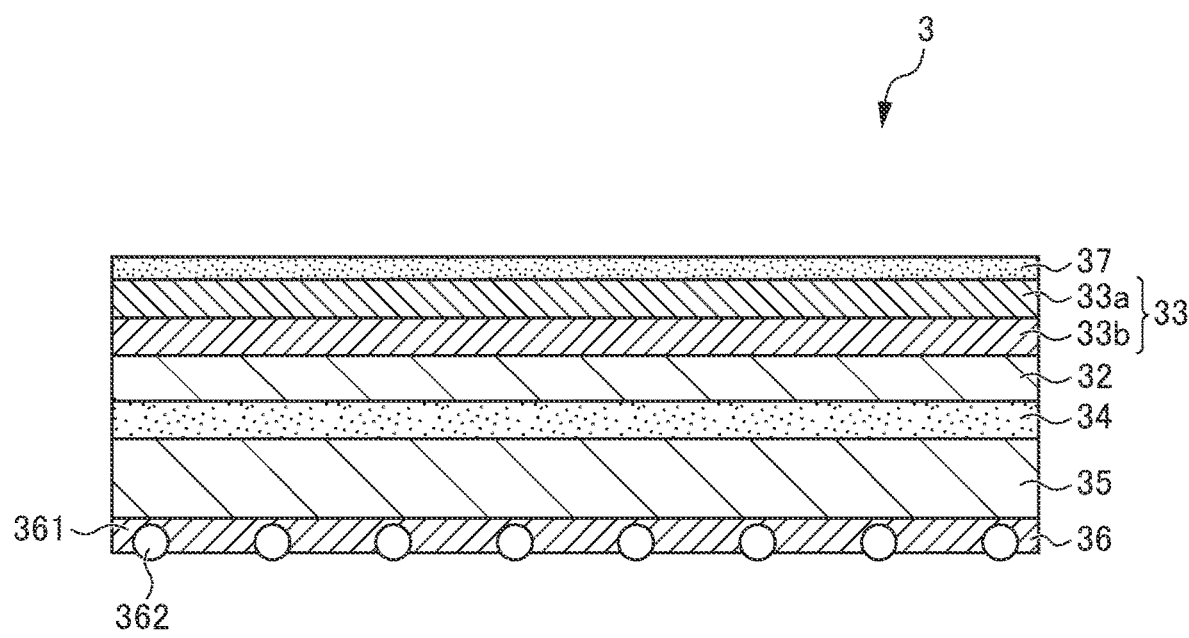
FIG. 7 is a cross-sectional view schematically illustrating a barrier film arranged on a display device of a wavelength conversion sheet according to another embodiment of the present invention.

In the case of a wavelength conversion sheet 30 of FIG. 6, primer layers 37 and 47 are laminated on the surfaces of the barrier films 3 and 4, respectively, between which a phosphor layer 31 is laminated. As a result, adhesion between the barrier film and the phosphor layer can be improved. Here, as illustrated in FIG. 7, a primer layer 37, a barrier layer 33 (an organic coating layer 33a and an inorganic oxide thin film layer 33b), a first substrate layer 32, an adhesive layer 34, a second substrate layer 35, and a mat layer 36 are laminated in this order, in a barrier film 3 for use in the wavelength conversion sheet 30 illustrated in FIG. 6. A barrier film 4 has the same layer structure as the barrier film 3, except that the mat layer of the barrier film 3 is omitted. Specifically, a primer layer 47, a barrier layer 43 (an organic coating layer 43a and an inorganic oxide thin film layer 43b), a first substrate layer 42, a adhesive layer 44, and a second substrate layer 45 are laminated in this order in the barrier film 4. The surfaces of the barrier films 3 and 4 on the side of the primer layers 37 and 47, respectively, are laminated so as to contact the phosphor layer 31.

Figure 8:
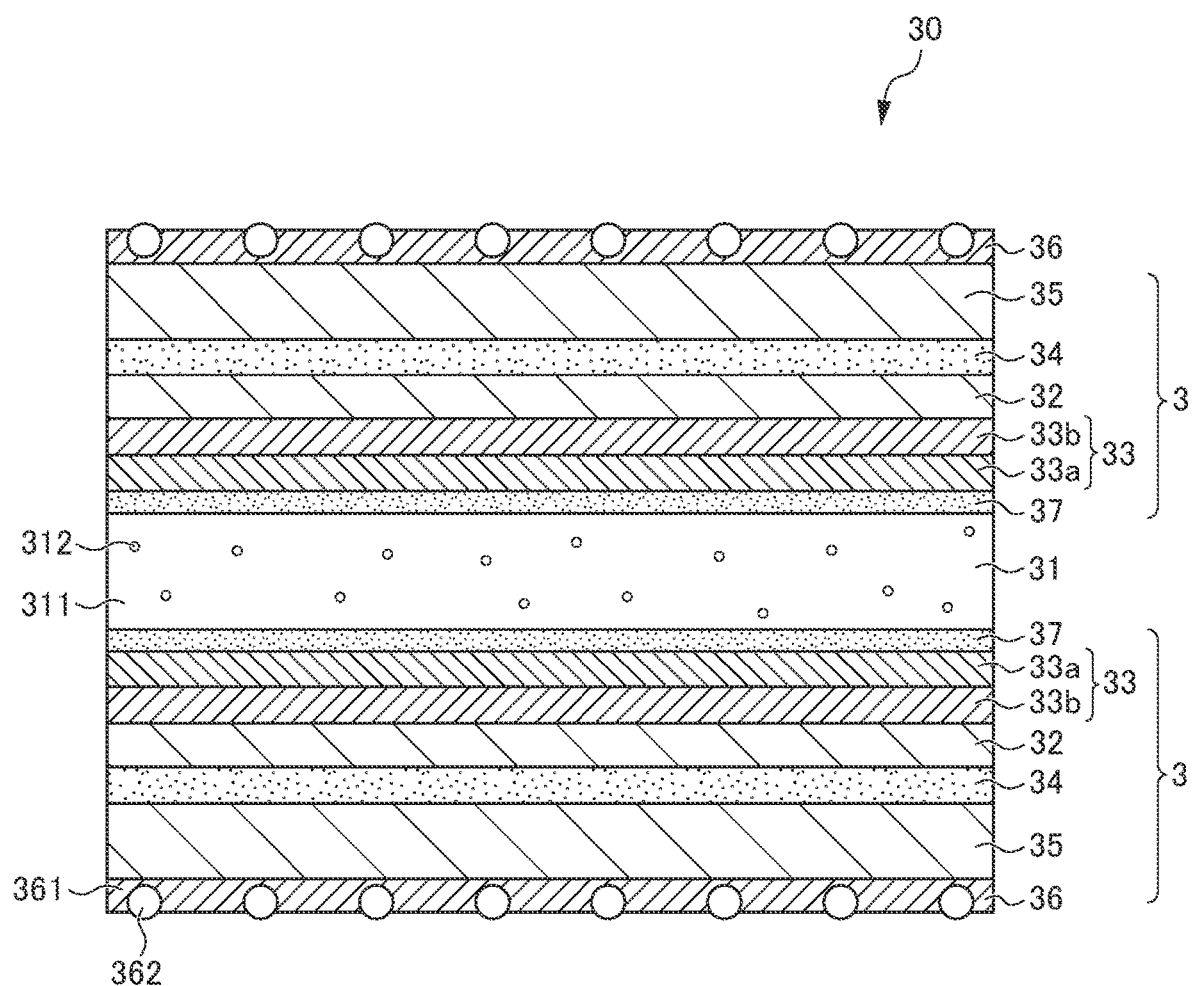
FIG. 8 is a cross-sectional view schematically illustrating a wavelength conversion sheet according to another embodiment of the present invention.

Here, as illustrated in FIG. 8, the wavelength conversion sheet 30 may have a configuration in which two of the barrier films 3 illustrated in FIG. 7 are laminated such that the primer layers 37 contact the front and back surfaces of the phosphor layer 31, and the mat layers 36 are exposed on the front and back surfaces of the wavelength conversion sheet 30, respectively. The mat layers are arranged on the surfaces of the wavelength conversion sheet 30, whereby in the case of configuring the display device using this wavelength conversion sheet 30 (see FIGS. 3 to 5), the wavelength conversion sheet 30 and the light guide plate 6 or the diffuser plate 8 can be restrained from sticking together or being scratched, and the wavelength conversion sheet 30 and the optical sheet (prism sheet 73) can also be restrained from sticking together or being scratched. The primer layer may be laminated between the barrier layer and the phosphor layer as in the case of the wavelength conversion sheet of the embodiment illustrated in FIG. 6, or may be laminated between the substrate layer and the phosphor layer, for example. Hereinafter, the primer layer will be described.

(Primer Layer)

Examples of the primer layer may include a primer layer containing a polyurethane resin composition, preferably containing a silane coupling agent and fillers.

The following examples can be used as the polyurethane resin composition: specifically, for example, a polymer obtained by a reaction of polyfunctional isocyanate with hydroxyl group-containing compound, specifically, for example, aromatic polyisocyanate such as trylenediisocyanate, diphenylmethane diisocyanate, and polymethylene polyphenylene polyisocyanate; or one- or two-component polyurethane resin obtained by a reaction of polyfunctional isocyanate such as aliphatic polyisocyanate such as hexamethylene diisocyanate and xylylene diisocyanate with a hydroxyl group-containing compound such as polyether polyol, polyester polyol, or polyacrylate polyol. Polyurethane resin as described above is used in the present embodiment, whereby extensibility of the primer layer is improved, for example, post-processing suitability in lamination or bag making is improved, and cracks and the like are prevented from occurring in the barrier layer during post-processing.

The content of the polyurethane resin composition based on the total amount of the primer layer is preferably 40% by mass or more, and more preferably 70% by mass or more. When the content is 40% by mass or more, extensibility of the primer layer is further improved. The risk of causing cracks in the primer layer can be further reduced.

As the silane coupling agent, an organofunctional silane monomers with binary reactivity can be used, and the following examples can be used: one or more of aqueous solutions such as γ-chloropropyltrimethoxysilane, vinyltrichlorosilane, vinyltriethoxysilane, vinyl-tris(β-methoxyethoxy)silane, γ-methacryloxypropyltrimethoxysilane, β-(3, 4-epoxycyclohexyl)ethyltrimethoxysilane, γ-glycidoxypropyltrimethoxysilane, vinyltriacetoxysilane, γ-mercaptopropyltrimethoxysilane, N-β(aminoethyl)-γ-aminopropyltrimethoxysilane, N-β(aminoethyl)-γ-aminopropylmethyldimethoxysilane, γ-ureidopropyltriethoxysilane, bis(β-hydroxyethyl)-γ-aminopropyltriethoxysilane, or γ-aminopropyl silicone.

A functional group, which is usually chloro, alkoxy, or acetoxy group, at one end of the molecule of the silane coupling agent, is hydrolyzed to form a silanol group (SiOH), the silane coupling agent is modified via covalent bond or the like on the surface of the organic coating layer or the inorganic oxide thin film layer and an ink capable of forming the phosphor layer, and a strong bond is formed.

On the other hand, an organic functional group such as vinyl, methacryloxy, amino, epoxy, or mercapto group at the other end of the silane coupling agent is formed on a thin film of the silane coupling agent.

The content of the silane coupling agent based on the total amount of the primer layer is preferably 1% by mass or more and 30% by mass or less, and more preferably 3% by mass or more and 20% by mass or less. When the content is 1% by mass or more, adhesion between the barrier layer and the primer layer is further improved, and adhesion between the primer layer and the phosphor layer is further improved. When the content is 30% by mass or less, extensibility of the primer layer is further improved. The risk of causing cracks in the primer layer can be further reduced.

For example, calcium carbonate, barium sulfate, alumina white, silica, talc, glass frit, resin powder, or the like can be used as the filler. The foregoing is intended to adjust the viscosity and the like of the primer agent and to enhance coating suitability and the like.

The content of the fillers based on the total amount of the primer layer is preferably 0.5% by mass or more and 30% by mass or less, and more preferably 1% by mass or more and 10% by mass or less. When the amount is 0.5% by mass or more, coating suitability of the substrate layer is improved, and blocking can be further prevented. When the content is 30% by mass or less, the haze value of the primer layer can be restrained from increasing.

Additives such as a stabilizer, a curing agent, a cross-linking agent, a lubricant, an ultraviolet absorber, and the like may be optionally further added to the primer layer as needed.

The primer layer preferably has high total light transmittance as measured in accordance with JIS K 7361, in order to avoid blocking of light from the backlight source. Specifically, the total light transmittance of the primer layer of the present embodiment as measured in accordance with JIS K 7361 is preferably 85% or more, and more preferably 90% or more. The total light transmittance is a value measured when the primer layer is formed on a PET film (film thickness: 12 μm).

The film thickness of the primer layer is preferably 0.05 μm or more and 10 μm or less, and more preferably 0.1 μm or more and 3 μm or less, for example.

The order of lamination in the barrier film 3 is not limited to the aforementioned order, and for example, the barrier layer 33 and the first substrate layer 32 may be replaced in the layer structure; specifically, the primer layer 37, the first substrate layer 32, the barrier layer 33 (the inorganic oxide thin film layer 33b and the organic coating layer 33a), the adhesive layer 34, the second substrate layer 35, and the mat layer 36 may be laminated in this order. As for the barrier film 4 as well, the primer layer 47, the first substrate layer 42, the barrier layer 43 (the inorganic oxide thin film layer 43b and the organic coating layer 43a), the adhesive layer 44, and the second substrate layer 45 may be laminated in this order.

Figure 9:
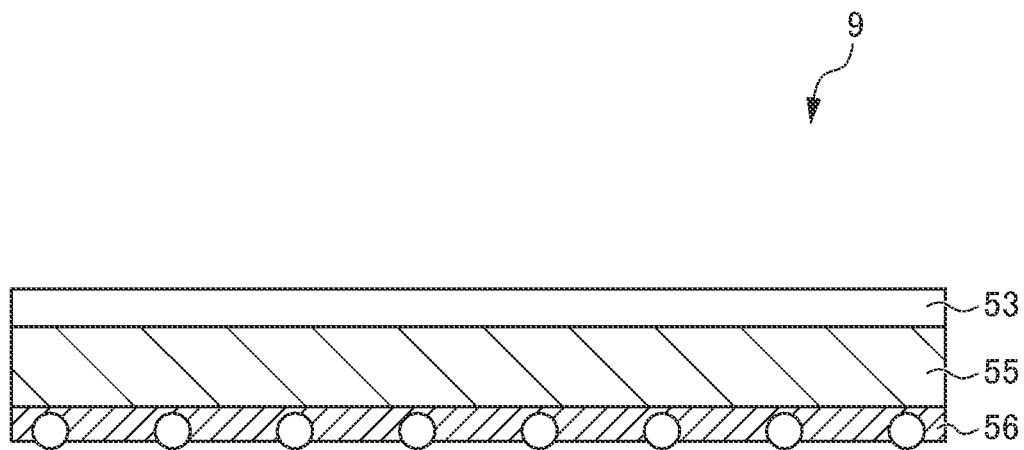
FIG. 9 is a cross-sectional view schematically illustrating a barrier film according to another embodiment of the present invention.

The barrier film with a mat layer may have a layer structure as in the case of the barrier film 9 illustrated in FIG. 9, in which the barrier layer 53 is formed on one surface of a single substrate layer 55, and the mat layer 56 is formed on the other surface of the substrate layer 55. Here, the barrier layer 53 may be configured similar to the barrier layer 13 described above, and the mat layer 56 may be configured similar to the mat layer 16 described above. The substrate layer 55 is a base material which functions as both of the first substrate layer and the second substrate layer described above. Specifically, the substrate layer 55 is a base material on which the barrier layer is formed, and is a base material for improving handling properties of the barrier film. Therefore, the substrate layer 55 is formed of the same material as that of the first substrate layer and the second substrate layer described above; and the thickness of the substrate layer 55 is preferably greater than 25 μm and 200 μm or less, more preferably 38 μm or more and 175 μm or less, and still more preferably 50 μm or more and 150 μm or less. The layer structure as such allows for further simplifying the layer structure of the barrier film, reducing the manufacturing process of the barrier film, and reducing the manufacturing cost of the barrier film.

<<5. Method of Manufacturing Barrier Film>>

An example of a method of manufacturing the barrier film 1 illustrated in FIG. 2 will be described. For example, the method of manufacturing the barrier film 1 is a method of manufacturing a barrier film, the method including: a barrier layer laminating process of laminating the barrier layer 13 on one surface of the first substrate layer 12; a second substrate layer laminating process of laminating the second substrate layer 15 via the adhesive layer 14 on the surface on the barrier layer 13 lamination side of the barrier film 12; and a mat layer laminating process of laminating the mat layer 16 on the surface on the second substrate layer 15 side of the barrier film.

[Barrier Layer Laminating Process]

In the barrier layer laminating process, the organic coating layer and/or the inorganic oxide thin film layer as a barrier layer are/is laminated on one surface of the substrate film. The organic coating layer can be formed by coating and curing a coating agent containing water-soluble polymer or the like such as polyvinyl alcohol. Examples of the method of applying the coating agent may include roll coating, gravure coating, knife coating, dip-coating, spray coating, and other coating methods. The inorganic oxide thin film layer can be formed by vapor deposition of inorganic oxide. Examples of the method of depositing inorganic oxide may include a physical vapor deposition (PVD) method such as a vacuum deposition method, a sputtering method, and an ion plating method, or a chemical vapor deposition (CVD) method such as a plasma enhanced chemical vapor deposition method, a thermochemical vapor deposition method, and a photochemical vapor deposition method.

A layer composed of a primer coating agent layer, an undercoating agent layer, an anchor coating agent layer, and an adhesive, or a vapor-deposited anchor coating agent layer or the like may be optionally formed on one surface of the substrate film in advance to form a surface treated layer.

The value of oxygen permeability as measured in accordance with JIS K-7126 is preferably 5 cc/m$^2$ day atm (23° C., 90% RH) or less, as the value of barrier properties at the stage when the substrate film and the barrier layer film have been laminated. The value of water vapor transmission rate as measured in accordance with JIS K-7129 B method is preferably 5 g/m$^2$·day·atm (40° C., 90% RH) or less. Oxygen permeability can be measured with, for example, OX-TRAN which is an oxygen permeability measuring device manufactured by MOCON Inc. (Mocon method). Water vapor barrier properties can be measured with, for example, PERMATRAN which is a water vapor transmission rate measuring device manufactured by MOCON Inc.

[Second Substrate Layer Laminating Process]

In the second substrate layer laminating process, the second substrate layer is laminated via the adhesive layer 14 on the surface of the barrier layer 13. Specifically, an adhesive is applied to the surface of the barrier layer 13, and another substrate film is superimposed thereon. The glue can be applied by roll coating, gravure coating, knife coating, dip-coating, spray coating, or other coating methods, or by a printing method or the like.

[Mat Layer Laminating Process]

In the mat layer laminating process, the mat layer 16 is laminated on the surface on the second substrate layer 15 side of the barrier film. Specifically, the mat layer can be formed by applying a coating agent for laminating a mat layer containing resin, fillers, solvents, and the like to the surface on the second substrate layer 15 side of the barrier film, and curing the coating agent. Examples of the method of applying the coating agent may include roll coating, gravure coating, knife coating, dip-coating, spray coating, and other coating methods.

<<6. Method of Manufacturing Barrier Film of Another Embodiment>

An example of a method of manufacturing the barrier film 3 illustrated in FIG. 7 will be described. For example, the method of manufacturing the barrier film 3 includes: a barrier layer laminating process of laminating the barrier layer 33 on one surface of the first substrate layer 32; a primer layer laminating process of laminating the primer layer 37 on the surface of the barrier layer; a mat layer laminating process of laminating the mat layer 36 on one surface of the second substrate layer 35; and a second substrate layer laminating process of laminating the second substrate layer 35 via the adhesive layer 34 on the surface (the surface on which no barrier layer is laminated) of the first substrate layer 32.

In the primer layer laminating process, specifically, a primer agent is applied to the surface of the barrier layer 33. The primer agent, in which solvents, diluents or the like are added and mixed into the resin composition or the like, is applied to the surface of the organic coating layer or the inorganic oxide thin film layer with a coating method such as roll coating, gravure coating, knife coating, dip-coating, spray coating, or any other coating methods; and the coating film is dried to remove the solvents, diluents or the like. Thus, the primer layer can be laminated.

An example of the method of manufacturing the barrier film 9 illustrated in FIG. 9 will be described. For example, the method of manufacturing the barrier film 9 includes: a barrier layer laminating process of laminating the barrier layer 53 on one surface of the substrate layer 55; and a mat layer laminating process of laminating the mat layer 56 on the other surface of the substrate layer 55. Processes similar to those of the method of manufacturing the barrier film 1 or 3 described above can be used for the barrier layer laminating process and the mat layer laminating process.

<<7. Method of Manufacturing Wavelength Conversion Sheet>>

For example, the wavelength conversion sheet can be manufactured by using the barrier film 1 illustrated in FIG. 2 and the barrier film 2 manufactured with the method of manufacturing a barrier film including the barrier layer laminating process and the second substrate layer laminating process. Specifically, a mixed solution (ink) containing the phosphor 110 and the sealing resin 111 is applied to the surface of the first substrate layer 12 of the barrier film 1. The mixed solution (ink) is brought in contact with the surface of the first substrate layer 22 of the barrier film 2 and is cured, whereby the wavelength conversion sheet 10 illustrated in FIG. 1 can be manufactured. A mixed solution (ink) containing the phosphor 112 and the sealing resin 111 may be applied to the surface of the first substrate layer 22 of the barrier film 2.

The wavelength conversion sheet illustrated in FIG. 6 can be manufactured in a similar manner, in which a mixed solution (ink) containing phosphor 312 and sealing resin 311 is applied to the surface of the primer layer 37, 47 of the barrier film 3, 4. Specifically, the mixed solution is applied to the surface of any one of the primer layers of the barrier films 3 and 4, brought in contact with the surface of the other primer layer of the barrier films, and cured, whereby the wavelength conversion sheet illustrated can be manufactured.

The wavelength conversion sheet illustrated in FIG. 8 can be manufactured, in which a mixed solution (ink) containing the phosphor 312 and the sealing resin 311 is applied to the surface of any one of the primer layers of the two barrier films 3, brought in contact with the surface of the other primer layer of the barrier films, and cured.

<<8. Method of Manufacturing Display Device>>

A display device can be manufactured through a process, in which the light guide plate is arranged on the surface of the mat layer of the wavelength conversion sheet.

Examples

Hereinafter, the present invention will be described in further detail by Examples; however, the present invention is not limited in any way by such description.

<Manufacturing of Barrier Film>

A barrier layer was laminated on the surface of the first substrate layer. Specifically, firstly, a substrate film (biaxially stretched poly ethylene terephthalate film, 12 µm) was mounted on a feed roll of a vacuum deposition system of a take-up type; secondly, while unwinding the substrate film, an inorganic coating layer (barrier layer) of aluminum oxide having a film thickness of 10 nm was formed on one surface of the substrate film, with a vacuum deposition method on an electron beam (EB) heating system, using aluminum as a deposition source while supplying oxygen gas.

Next, on the other hand, a hydrolysis solution consisting of a composition (b) ethyl silicate, hydrochloric acid, isopropyl alcohol, and ion-exchanged water prepared in advance was added to a mixed solution consisting of a composition (a) polyvinyl alcohol, isopropyl alcohol, and ion-exchanged water, followed by stirring to obtain a colorless and transparent gas barrier composition.

Next, the gas barrier composition was applied on top of the inorganic coating layer (barrier layer) with a gravure roll coating method, and then heat-treated at 100° C. for 10 seconds to form an organic coating layer (barrier layer) having a thickness of 300 nm (in dry condition). Next, the primer layer was laminated on top of the barrier layer (organic coating layer). Firstly, γ-glycidoxypropyltrimethoxysilane was used as the silane coupling agent and a polyurethane resin composition consisting of 1.0 wt % of the silane coupling agent, 1.0 wt % of silica powder, 13 to 15 wt % of polyurethane resin, 3 to 4 wt % of nitrocellulose, 31 to 38 wt % of toluene, 29 to 30 wt % of methyl ethyl ketone (MEK), and 15 to 16% of isopropyl alcohol (IPA) was obtained.

The polyurethane resin composition was applied to the barrier layer of the film laminated with the barrier layer, with a roll coating method, and then dried at 120° C. for 20 seconds to laminate the primer layer of 500 nm composed of the polyurethane resin composition. The laminate is laminated in the order of primer layer/organic coating layer (barrier layer)/inorganic oxide thin film layer (barrier layer)/substrate film (first substrate layer).

Next, the mat layer was laminated on one surface of another substrate film (biaxially stretched poly ethylene terephthalate film, 50 μm). Specifically, spherical particles containing polyacrylic resin as fillers (Epostar MA, resin as acrylic-based crosslinked product having compressive strength of 2.8 kgf/mm$^2$ or more; an average particle size of the fillers is 4 μm) were mixed with acrylic resin as resin to prepare a coating agent for forming a mat layer (solid content and filler content are described in the Tables below). The coating agent was applied to the surface of the substrate film with a gravure roll coating method (coating amount after drying is described in the Tables below).

Next, polyurethane adhesive of a two-component curing type for lamination was applied to the surface on the substrate film (second substrate layer) side, on which the mat layer has been laminated, with a gravure roll coating method, and an adhesive layer having a thickness of 4.0 g/m$^2$ (in dry condition) was formed.

Next, the substrate film (first substrate layer) side of the laminate, on which the barrier layer has been laminated, was superimposed on the surface of the adhesive layer, and the laminate was dry-laminated to manufacture barrier films of Examples 1 to 11 and Comparative Examples 1 to 8 as illustrated in FIG. 7 (laminated in the order of "primer layer/organic coating layer (barrier layer)/inorganic oxide thin film layer (barrier layer)/substrate film (first substrate layer)/adhesive layer/second substrate layer/mat layer").

A barrier film of Comparative Example 9 without laminating a mat layer was manufactured (laminated in the order of "primer layer/organic coating layer (barrier layer)/inorganic oxide thin film layer (barrier layer)/substrate film (first substrate layer)/adhesive layer/second substrate layer").

<Measurement of Haze Value>

Haze values were measured for an anti-sticking layer of the barrier film of the Examples and Comparative Examples. Specifically, a haze value (%) of the anti-sticking layer was measured with a haze meter (HM-150: manufactured by Murakami Color Research Laboratory) in accordance with JIS K7136. Results are illustrated in Tables 1 and 2.

<Manufacturing of Wavelength Conversion Sheet>

A wavelength conversion sheet was manufactured using the barrier film of the Examples and Comparative Examples. Specifically, phosphor (quantum dots having an average particle size 3 to 5 nm) including a core composed of cadmium selenide (CdSe) and a shell composed of zinc sulfide (ZnS) was mixed with sealing resin (urethane acrylate resin which is an ionizing radiation curable compound), such that the ratio of the phosphor was 1 part by mass per 100 parts by mass of the sealing resin, whereby a mixed solution (ink) for forming a phosphor layer was manufactured.

The mixed solution (ink) for forming a phosphor layer was applied to the surface on the first substrate layer side of the barrier film of the Examples and Comparative Examples. The mixed solution (ink) was superimposed and brought into contact with the surface of the first substrate layer of the barrier film without laminating a mat layer (laminated in the order of "first substrate layer/inorganic oxide thin film layer/organic coating layer/adhesive layer/second substrate layer"), and the mixed solution (ink) was dried so that the thickness of the phosphor layer became 100 μm, whereby a wavelength conversion sheet was manufactured.

<Sticking Test>

A sticking confirmation test was conducted on the wavelength conversion sheet and the light guide plate after an environmental test. Specifically, the mat layer of the wavelength conversion sheet (50 mm×50 mm) and the light guide plate were laminated such that the mutual wavelength conversion sheets contact with each other, whereby a wavelength conversion sheet with a light guide plate was manufactured. Further, a weight of 300 g was placed on the wavelength conversion sheet so as to be subject to weight bearing. The wavelength conversion sheet with the light guide plate was left in an environmental test at temperature of 60° C., humidity of 90%, and temperature of 80° C. for 100 hours, and a sticking confirmation test was conducted on the wavelength conversion sheet with the light guide plate after standing for 100 hours. Evaluation results are illustrated in Tables 1 and 2 (denoted as "sticking" in the Tables).

(Evaluation Criteria)

o: No sticking was confirmed between the barrier film and the light guide plate, or slight sticking was confirmed to an extent that causes substantially no problems.

x: Sticking was confirmed to a great extent between the barrier film and the light guide plate.

<Hardness Confirmation Test>

Pencil hardness of the surface of the mat layer of the barrier film of the Examples and Comparative Examples was measured and confirmed with a test in accordance with JISK5600-5-4 (1999). Evaluation results are illustrated in Tables 1 and 2 (denoted as "pencil hardness" in Table 1). Here, in the evaluation of "pencil hardness" illustrated in Tables 1 and 2, "less than B" denotes pencil hardness softer than B, and "H or more" denotes pencil hardness equal to or harder than H.

<Vibration Test>

A vibration test was carried out to confirm the effects of preventing foreign matter from scratching the mat layer of the barrier film of the Examples and Comparative Examples. Specifically, two barrier films of the Examples and the Comparative Examples (lower surface, 200 mm×200 mm; and upper surface, 200 mm×100 mm) were prepared and placed in a vibrating device (Color Fastness Rubbing Tester AB-301 manufactured by TESTER SANGYO CO., LTD.) such that the mat layers (or the second substrate layers in the case of the barrier film of Comparative Example 9) face each other. Ten glass beads of φ 0.3 mm were placed between the two barrier films.

A weight (200 g×6 pieces) was placed via the resin film on the barrier film, an oscillation rate was set to 0.5 Hz, vibration was carried out for 10 minutes, and occurrence of scratches was visually confirmed. Evaluation results are illustrated in Table 1 ("vibration test" in Table 1).

(Evaluation Criteria)

o: No occurrence of scratches was confirmed in the layers (the mat layer, etc.) contacting the glass beads.

x: Occurrence of scratches was confirmed in the layers (the mat layer, etc.) contacting the glass beads.

TABLE 1

|  | Comparative Example 1 | Example 1 | Example 2 | Example 3 | Comparative Example 2 |
|---|---|---|---|---|---|
| Filler concentration (% by mass) | 1.5 | 1.7 | 1.7 | 3.4 | 0.5 |
| Coating amount (g/m$^2$) | 0.94 | 1.60 | 1.60 | 3.18 | 0.63 |
| Thickness of mat layer (μm) | 0.88 | 1.50 | 1.51 | 2.89 | 0.59 |
| Haze value (%) | 9.7 | 11.4 | 10.2 | 21.4 | 6.8 |
| Total number of fillers in 1 mm$^2$ (number) | 1685 | 2251 | 2087 | 3459 | 1118 |
| Ratio of fillers having particle size twice or more (%) | 80.8 | 75.5 | 74.3 | 37.5 | 81.3 |
| Sticking | ○ | ○ | ○ | ○ | ○ |
| Pencil hardness | B | HB | HB | HB | less than B |
| Vibration test | x | ○ | ○ | ○ | x |

|  | Example 4 | Example 5 | Example 6 | Example 7 | Example 8 |
|---|---|---|---|---|---|
| Filler concentration (% by mass) | 1.0 | 1.5 | 1.5 | 2.0 | 1.5 |
| Coating amount (g/m$^2$) | 1.35 | 1.55 | 2.41 | 2.13 | 3.42 |
| Thickness of mat layer (μm) | 1.24 | 1.43 | 2.23 | 1.98 | 3.25 |
| Haze value (%) | 13.8 | 20.1 | 25.9 | 30.1 | 29 |
| Total number of fillers in 1 mm$^2$ (number) | 2952 | 3936 | 4293 | 11986 | 4368 |
| Ratio of fillers having particle size twice or more (%) | 77.3 | 65.5 | 37.2 | 27.9 | 22.2 |
| Sticking | ○ | ○ | ○ | ○ | ○ |
| Pencil hardness | HB | HB | F | H or more | F |
| Vibration test | ○ | ○ | ○ | ○ | ○ |

TABLE 2

|  | Comparative Example 3 | Comparative Example 4 | Comparative Example 5 | Comparative Example 6 | Example 9 |
|---|---|---|---|---|---|
| Filler concentration (% by mass) | 1.5 | 1.5 | 1.5 | 0.5 | 1.0 |
| Coating amount (g/m$^2$) | 4.19 | 5.18 | 6.51 | 0.55 | 1.26 |
| Thickness of mat layer (μm) | 3.92 | 4.83 | 5.94 | 0.51 | 1.16 |
| Haze value (%) | 29.9 | 30.8 | 30.6 | 7.8 | 19 |
| Total number of fillers in 1 mm$^2$ (number) | 5814 | 6380 | 8259 | 1193 | 3772 |
| Ratio of fillers having particle size twice or more (%) | 12.6 | 7 | 3.1 | 92.5 | 62.1 |
| Sticking | ○ | ○ | ○ | ○ | ○ |
| Pencil hardness | B | B | B | less than B | HB |
| Vibration test | x | x | x | x | ○ |

|  | Example 10 | Comparative Example 7 | Comparative Example 8 | Example 11 | Comparative Example 9 |
|---|---|---|---|---|---|
| Filler concentration (% by mass) | 1.5 | 1.5 | 1.5 | 2.0 | — |
| Coating amount (g/m$^2$) | 1.08 | 3.91 | 4.96 | 1.77 | — |
| Thickness of mat layer (μm) | 0.99 | 3.70 | 4.53 | 1.63 | — |
| Haze value (%) | 27.4 | 34.4 | 35.2 | 35.2 | — |
| Total number of fillers in 1 mm$^2$ (number) | 7349 | 7349 | 6067 | 8259 | — |
| Ratio of fillers having particle size twice or more (%) | 54.6 | 7.7 | 8.1 | 33.8 | — |
| Sticking | ○ | ○ | ○ | ○ | x |

TABLE 2-continued

| Pencil hardness | H or more | B | B | H or more | — |
|---|---|---|---|---|---|
| Vibration test | ○ | x | x | ○ | x |

"Filler concentration" in the Tables represents percent (%) by mass of the fillers in the total amount of the solvents for forming the mat layer.
"Coating amount" in the Tables represents a coating amount per unit area (mass of solid; the unit is g/m$^2$) of the mat layer after drying.
"Thickness of mat layer" in the Tables represents thickness (the unit is μm) of the mat layer after drying. The thickness of the mat layer can be measured, for example, through SEM observation of a cross section of the mat layer.
"Total number of fillers" in 1 mm$^2$" in the Tables represents a value calculated with the aforementioned method using a laser microscope (OLS4000 manufactured by Olympus Corporation). More specifically, a predetermined area (258 × 260 μm) in a plan view of the surface of the mat layer was observed with the laser microscope, and the total number of the fillers in the predetermined area (258 × 260 μm) was converted into the number per 1 × 1 mm$^2$. A 50-power objective lens was used in the laser microscope.
"Ratio of fillers having particle size twice or more" in the Tables represents the ratio of fillers protruding from the mat layer and being visually recognizable as having a particle size that is at least twice the thickness of the mat layer, in a plan view of the mat layer, and is a value calculated with the aforementioned method using the laser microscope (OLS4000 manufactured by Olympus Corporation).

The evaluation results show that the barrier film for the wavelength conversion sheet of the present invention has excellent environmental stability, in which the light guide plate and the wavelength conversion sheet in the display device do not stick together, even in the case of changing the atmospheric environment under which the display device is placed.

As for the barrier films of Examples 1 to 11, the ratio of the fillers visually recognizable as having a particle size that is at least twice the thickness of the mat layer was 20% or more and 80% or less of the total amount of the fillers protruding from the mat layer; the total number of fillers in a square of 1 mm$^2$ in a plan view of the mat layer was 1,800 or more; the pencil hardness was "HB" or more (evaluation equivalent to or harder than HB); and no occurrence of scratches was confirmed in the vibration test. The test results show that the barrier film can effectively restrain scratches from occurring in the mat layer.

"Thickness of mat layer" and "ratio of fillers having particle size twice or more" in the Tables show a tendency, in which the thinner the thickness of the mat layer, the greater the ratio of the fillers having a particle size that is at least twice the thickness of the mat layer; and the thicker the thickness of the mat layer, the smaller the ratio of the fillers having a particle size that is at least twice the thickness of the mat layer; however, some of the Examples and Comparative Examples may show a tendency different from the aforementioned tendency. For example, as for Examples 5 to 7, the thickness of the mat layer is thicker and the ratio of the fillers having a particle size that is at least twice the thickness of the mat layer is accordingly smaller in Example 6 than in Example 5; and the thickness of the mat layer is thinner and the ratio of the fillers having a particle size that is at least twice the thickness of the mat layer is smaller in Example 6 than in Example 7. This is considered to be because, when the filler concentration in the coating liquid is changed, the degree of transferring the fillers at the time of coating is also changed, so that it is difficult to obtain the aforementioned tendency in terms of "thickness of mat layer" and "ratio of fillers having particle size that is at least twice thickness of mat layer" in comparison with different filler concentrations.

EXPLANATION OF REFERENCE NUMERALS 1, 3, 9: barrier film (barrier film with mat layer)
2, 4: barrier film
11, 31: phosphor layer
111, 311: sealing resin
112, 312: phosphor
12, 22, 32, 42: substrate layer (first substrate layer)
13, 23, 33, 43: barrier layer
13a, 23a, 33a, 43a: organic coating layer
13b, 23b, 33b, 43b: inorganic oxide thin film layer
14, 24, 34, 44: adhesive layer
15, 25, 35, 45: substrate layer (second substrate layer)
16, 36: mat layer
161, 361: resin
162, 362: filler
37, 47: primer layer
55: substrate layer
10, 30: wavelength conversion sheet
5: light source unit
6: light guide plate
7: reflective sheet
8: diffuser plate
70, 80: display device
71: LCD panel
72: polarization selective reflective sheet
73: prism sheet

The invention claimed is:

1. A barrier film comprising a multilayer film comprising at least a barrier layer and a substrate layer, wherein
   a mat layer comprising a resin and fillers is laminated on one surface of the barrier film, at least part of the fillers protruding from the mat layer,
   a ratio of the fillers protruding from the mat layer and being visually recognizable as having a particle size that is at least twice a thickness of the mat layer is 20% or more and 80% or less of a total amount of the fillers protruding from the mat layer, in a plan view of the mat layer, and
   a total number of the fillers in a square of 1 mm$^2$ in a plan view of the mat layer is 1,800 or more.

2. The barrier film according to claim 1, wherein the fillers comprised in the mat layer comprise at least one or more resins selected from the group consisting of acrylic resin, polystyrene resin, nylon resin, and polyethylene resin.

3. The barrier film according to claim 1, wherein the resin comprised in the mat layer comprises acrylic resin.

4. The barrier film according to claim 1, wherein a primer layer is laminated on a surface on an opposite side of the barrier film with respect to the mat layer.

5. The barrier film according to claim 1, wherein the fillers comprise resin having compressive strength of 2.8 kgf/mm$^2$ or more as measured in accordance with JIS A 9511.

6. The barrier film according to claim 1, wherein a coating amount of the mat layer after drying is 1.0 g/m$^2$ or more and 3.6 g/m$^2$ or less, and a haze value of the mat layer as measured in accordance with JIS K7136 is 10% or more and 35% or less.

7. A wavelength conversion sheet, comprising: a phosphor layer comprising phosphor; and the barrier film according to claim 1, wherein the phosphor layer has a first surface and the barrier film has a second surface on an opposite side to a surface on which the mat layer is laminated, and wherein the phosphor layer and the barrier film are laminated such that the first surface and the second surface face each other.

8. A display device of a surface mount type, the display device comprising a light guide plate, wherein
- an LCD panel, a polarization selective reflective sheet, a prism sheet, the wavelength conversion sheet according to claim 7, the light guide plate, and a reflective sheet are laminated in sequence,
- a light source unit is arranged at an end face of the light guide plate, and
- the light guide plate is arranged on a surface on a side of the mat layer of the wavelength conversion sheet.

9. A display device of a direct type, the display device comprising a diffuser plate, wherein
- an LCD panel, a polarization selective reflective sheet, a prism sheet, the wavelength conversion sheet according to claim 7, the diffuser plate, a light source unit, and a reflective sheet are laminated in sequence, and the diffuser plate is arranged on a surface on a side of the mat layer of the wavelength conversion sheet.

* * * * *